(12) United States Patent
Ogami et al.

(10) Patent No.: US 9,720,805 B1
(45) Date of Patent: Aug. 1, 2017

(54) SYSTEM AND METHOD FOR CONTROLLING A TARGET DEVICE

(75) Inventors: Kenneth Ogami, Bothell, CA (US); Andrew Best, Stanford, CA (US); Marat Zhaksilikov, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1299 days.

(21) Appl. No.: 12/058,534

(22) Filed: Mar. 28, 2008

Related U.S. Application Data

(63) Continuation-in-part of application No. 12/004,833, filed on Dec. 21, 2007, now Pat. No. 8,266,575.

(60) Provisional application No. 60/926,096, filed on Apr. 25, 2007.

(51) Int. Cl.
  *G06F 9/455* (2006.01)
  *G06F 9/44* (2006.01)
  *G06F 11/36* (2006.01)

(52) U.S. Cl.
  CPC ................ *G06F 11/3656* (2013.01)

(58) Field of Classification Search
  CPC ............ G06F 11/3656; G06F 11/3648; G06F 11/3664
  USPC ..................................... 703/23, 20
  See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedom |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |

(Continued)

FOREIGN PATENT DOCUMENTS

| | | |
|---|---|---|
| DE | 19710829 A1 | 9/1998 |
| EP | 0308583 A | 3/1989 |

(Continued)

OTHER PUBLICATIONS

Zorian et al., "Testing Embedded-Core Based System Chips," IEEE, 1998; 14 pages.

(Continued)

*Primary Examiner* — Kamini S Shah
*Assistant Examiner* — Juan Ochoa

(57) ABSTRACT

Target device monitoring systems and methods are presented. In one embodiment, a host emulation target device control method includes receiving high level express interface direction to change a design element value. The design element values are associated with an operating target device. Design element values corresponding to the direction are created. The design element values are also forwarded to the operating target device in real time.

19 Claims, 15 Drawing Sheets

(56) References Cited

U.S. PATENT DOCUMENTS

| | | |
|---|---|---|
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,571,507 A | 2/1986 | Collings |
| 4,604,363 A | 8/1986 | Newhouse et al. |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Kanda |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada, Jr. et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Del Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten et al. |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |

(56) References Cited

U.S. PATENT DOCUMENTS

| | | |
|---|---|---|
| 5,399,922 A | 3/1995 | Kiani et al. |
| 5,408,194 A | 4/1995 | Steinbach et al. |
| 5,408,235 A | 4/1995 | Doyle et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |
| 5,438,672 A | 8/1995 | Dey |
| 5,440,305 A | 8/1995 | Signore et al. |
| 5,451,887 A | 9/1995 | El Ayat et al. |
| 5,453,904 A | 9/1995 | Higashiyama et al. |
| 5,455,525 A | 10/1995 | Ho et al. |
| 5,455,731 A | 10/1995 | Parkinson |
| 5,455,927 A | 10/1995 | Huang |
| 5,457,410 A | 10/1995 | Ting |
| 5,457,479 A | 10/1995 | Cheng |
| 5,463,591 A | 10/1995 | Aimoto et al. |
| 5,479,603 A | 12/1995 | Stone et al. |
| 5,479,643 A | 12/1995 | Bhaskar et al. |
| 5,479,652 A | 12/1995 | Dreyer et al. |
| 5,481,471 A | 1/1996 | Naglestad et al. |
| 5,488,204 A | 1/1996 | Mead et al. |
| 5,491,458 A | 2/1996 | Mccune, Jr. et al. |
| 5,493,246 A | 2/1996 | Anderson |
| 5,493,723 A | 2/1996 | Beck et al. |
| 5,495,077 A | 2/1996 | Miller et al. |
| 5,495,593 A | 2/1996 | Elmer et al. |
| 5,495,594 A | 2/1996 | Mackenna et al. |
| 5,497,119 A | 3/1996 | Tedrow et al. |
| 5,499,192 A | 3/1996 | Knapp et al. |
| 5,500,823 A | 3/1996 | Martin et al. |
| 5,517,198 A | 5/1996 | Mcewan |
| 5,519,854 A | 5/1996 | Watt |
| 5,521,529 A | 5/1996 | Agrawal et al. |
| 5,530,444 A | 6/1996 | Tice et al. |
| 5,530,673 A | 6/1996 | Tobita et al. |
| 5,530,813 A | 6/1996 | Paulsen et al. |
| 5,537,057 A | 7/1996 | Leong et al. |
| 5,541,878 A | 7/1996 | Lemoncheck et al. |
| 5,542,055 A | 7/1996 | Amini et al. |
| 5,543,588 A | 8/1996 | Bisset et al. |
| 5,543,590 A | 8/1996 | Gillespie et al. |
| 5,543,591 A | 8/1996 | Gillespie et al. |
| 5,544,067 A | 8/1996 | Rostoker et al. |
| 5,544,311 A | 8/1996 | Harenberg et al. |
| 5,546,433 A | 8/1996 | Tran et al. |
| 5,546,562 A | 8/1996 | Patel |
| 5,552,725 A | 9/1996 | Ray et al. |
| 5,552,748 A | 9/1996 | O'Shaughnessy |
| 5,554,951 A | 9/1996 | Gough |
| 5,555,452 A | 9/1996 | Callaway et al. |
| 5,555,907 A | 9/1996 | Philipp |
| 5,557,762 A | 9/1996 | Okuaki et al. |
| 5,559,502 A | 9/1996 | Schutte |
| 5,559,996 A | 9/1996 | Fujioka |
| 5,563,526 A | 10/1996 | Hastings et al. |
| 5,563,529 A | 10/1996 | Seltzer et al. |
| 5,564,010 A | 10/1996 | Henry et al. |
| 5,564,108 A | 10/1996 | Hunsaker et al. |
| 5,565,658 A | 10/1996 | Gerpheide et al. |
| 5,566,702 A | 10/1996 | Philipp |
| 5,572,665 A | 11/1996 | Nakabayashi |
| 5,572,719 A | 11/1996 | Biesterfeldt |
| 5,574,678 A | 11/1996 | Gorecki |
| 5,574,852 A | 11/1996 | Bakker et al. |
| 5,574,892 A | 11/1996 | Christensen |
| 5,579,353 A | 11/1996 | Parmenter et al. |
| 5,587,945 A | 12/1996 | Lin et al. |
| 5,587,957 A | 12/1996 | Kowalczyk et al. |
| 5,590,354 A | 12/1996 | Klapproth et al. |
| 5,594,388 A | 1/1997 | O'Shaughnessy et al. |
| 5,594,734 A | 1/1997 | Worsley et al. |
| 5,594,876 A | 1/1997 | Getzlaff et al. |
| 5,594,890 A | 1/1997 | Yamaura et al. |
| 5,600,262 A | 2/1997 | Kolze |
| 5,604,466 A | 2/1997 | Dreps et al. |
| 5,608,892 A | 3/1997 | Wakerly |
| 5,614,861 A | 3/1997 | Harada |
| 5,619,430 A | 4/1997 | Nolan et al. |
| 5,625,316 A | 4/1997 | Chambers et al. |
| 5,625,583 A | 4/1997 | Hyatt |
| 5,629,857 A | 5/1997 | Brennan |
| 5,629,891 A | 5/1997 | Lemoncheck et al. |
| 5,630,052 A | 5/1997 | Shah |
| 5,630,057 A | 5/1997 | Hait |
| 5,630,102 A | 5/1997 | Johnson et al. |
| 5,631,577 A | 5/1997 | Freidin et al. |
| 5,633,766 A | 5/1997 | Hase et al. |
| 5,642,295 A | 6/1997 | Smayling |
| 5,646,544 A | 7/1997 | Iadanza |
| 5,646,901 A | 7/1997 | Sharpe-Geisler et al. |
| 5,648,642 A | 7/1997 | Miller et al. |
| 5,651,035 A | 7/1997 | Tozun et al. |
| 5,652,893 A | 7/1997 | Ben-Meir et al. |
| 5,661,433 A | 8/1997 | Larosa et al. |
| 5,663,900 A | 9/1997 | Bhandari et al. |
| 5,663,965 A | 9/1997 | Seymour |
| 5,664,199 A | 9/1997 | Kuwahara |
| 5,666,480 A | 9/1997 | Leung et al. |
| 5,670,915 A | 9/1997 | Cooper et al. |
| 5,673,198 A | 9/1997 | Lawman et al. |
| 5,675,825 A | 10/1997 | Dreyer et al. |
| 5,677,691 A | 10/1997 | Hosticka et al. |
| 5,680,070 A | 10/1997 | Anderson et al. |
| 5,682,032 A | 10/1997 | Philipp |
| 5,684,434 A | 11/1997 | Mann et al. |
| 5,684,952 A | 11/1997 | Stein |
| 5,686,844 A | 11/1997 | Hull et al. |
| 5,687,325 A | 11/1997 | Chang |
| 5,689,195 A | 11/1997 | Cliff et al. |
| 5,689,196 A | 11/1997 | Schutte |
| 5,691,664 A | 11/1997 | Anderson et al. |
| 5,691,898 A | 11/1997 | Rosenberg et al. |
| 5,694,063 A | 12/1997 | Burlison et al. |
| 5,696,952 A | 12/1997 | Pontarelli |
| 5,699,024 A | 12/1997 | Manlove et al. |
| 5,703,871 A | 12/1997 | Pope et al. |
| 5,706,453 A | 1/1998 | Cheng et al. |
| 5,708,589 A | 1/1998 | Beauvais |
| 5,708,798 A | 1/1998 | Lynch et al. |
| 5,710,906 A | 1/1998 | Ghosh et al. |
| 5,712,969 A | 1/1998 | Zimmermann et al. |
| 5,721,931 A | 2/1998 | Gephardt et al. |
| 5,724,009 A | 3/1998 | Collins et al. |
| 5,727,170 A | 3/1998 | Mitchell et al. |
| 5,728,933 A | 3/1998 | Schultz et al. |
| 5,729,704 A | 3/1998 | Stone et al. |
| 5,730,165 A | 3/1998 | Philipp |
| 5,732,277 A | 3/1998 | Kodosky et al. |
| 5,734,272 A | 3/1998 | Belot et al. |
| 5,734,334 A | 3/1998 | Hsieh et al. |
| 5,737,557 A | 4/1998 | Sullivan |
| 5,737,760 A | 4/1998 | Grimmer et al. |
| 5,745,011 A | 4/1998 | Scott |
| 5,748,048 A | 5/1998 | Moyal |
| 5,748,875 A | 5/1998 | Tzori |
| 5,752,013 A | 5/1998 | Christensen et al. |
| 5,754,552 A | 5/1998 | Allmond et al. |
| 5,754,826 A | 5/1998 | Gamal et al. |
| 5,757,368 A | 5/1998 | Gerpheide et al. |
| 5,758,058 A | 5/1998 | Milburn |
| 5,761,128 A | 6/1998 | Watanabe |
| 5,763,909 A | 6/1998 | Mead et al. |
| 5,764,714 A | 6/1998 | Stansell et al. |
| 5,767,457 A | 6/1998 | Gerpheide et al. |
| 5,774,704 A | 6/1998 | Williams |

(56) References Cited

U.S. PATENT DOCUMENTS

| | | |
|---|---|---|
| 5,777,399 A | 7/1998 | Shibuya |
| 5,781,030 A | 7/1998 | Agrawal et al. |
| 5,781,747 A | 7/1998 | Smith et al. |
| 5,784,545 A | 7/1998 | Anderson et al. |
| 5,790,957 A | 8/1998 | Heidari |
| 5,796,183 A | 8/1998 | Hourmand et al. |
| 5,799,176 A | 8/1998 | Kapusta et al. |
| 5,801,958 A | 9/1998 | Dangelo et al. |
| 5,802,073 A | 9/1998 | Platt |
| 5,802,290 A | 9/1998 | Casselman |
| 5,805,792 A | 9/1998 | Swoboda et al. |
| 5,805,897 A | 9/1998 | Glowny |
| 5,808,883 A | 9/1998 | Hawkes |
| 5,811,987 A | 9/1998 | Ashmore, Jr. et al. |
| 5,812,698 A | 9/1998 | Platt et al. |
| 5,818,254 A | 10/1998 | Agrawal et al. |
| 5,818,444 A | 10/1998 | Alimpich et al. |
| 5,818,736 A | 10/1998 | Leibold |
| 5,819,028 A | 10/1998 | Manghirmalani et al. |
| 5,822,387 A | 10/1998 | Mar |
| 5,822,531 A | 10/1998 | Gorczyca et al. |
| 5,828,693 A | 10/1998 | Mays et al. |
| 5,838,583 A | 11/1998 | Varadarajan et al. |
| 5,841,078 A | 11/1998 | Miller et al. |
| 5,841,996 A | 11/1998 | Nolan et al. |
| 5,844,256 A | 12/1998 | Mead et al. |
| 5,844,265 A | 12/1998 | Mead et al. |
| 5,844,404 A | 12/1998 | Caser et al. |
| 5,848,285 A | 12/1998 | Kapusta et al. |
| 5,850,156 A | 12/1998 | Wittman |
| 5,852,733 A | 12/1998 | Chien et al. |
| 5,854,625 A | 12/1998 | Frisch et al. |
| 5,857,109 A | 1/1999 | Taylor |
| 5,861,433 A | 1/1999 | Akimoto et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,867,015 A | 2/1999 | Corsi et al. |
| 5,867,046 A | 2/1999 | Sugasawa |
| 5,867,399 A | 2/1999 | Rostoker et al. |
| 5,869,979 A | 2/1999 | Bocchino |
| 5,870,004 A | 2/1999 | Lu |
| 5,870,309 A | 2/1999 | Lawman |
| 5,870,345 A | 2/1999 | Stecker |
| 5,872,464 A | 2/1999 | Gradinariu |
| 5,874,958 A | 2/1999 | Ludolph |
| 5,875,293 A | 2/1999 | Bell et al. |
| 5,877,656 A | 3/1999 | Mann et al. |
| 5,878,425 A | 3/1999 | Redpath |
| 5,880,411 A | 3/1999 | Gillespie et al. |
| 5,880,598 A | 3/1999 | Duong |
| 5,883,623 A | 3/1999 | Cseri |
| 5,886,582 A | 3/1999 | Stansell |
| 5,887,189 A | 3/1999 | Birns et al. |
| 5,889,236 A | 3/1999 | Gillespie et al. |
| 5,889,723 A | 3/1999 | Pascucci |
| 5,889,936 A | 3/1999 | Chan |
| 5,889,988 A | 3/1999 | Held |
| 5,894,226 A | 4/1999 | Koyama |
| 5,894,243 A | 4/1999 | Hwang |
| 5,894,565 A | 4/1999 | Furtek et al. |
| 5,895,494 A | 4/1999 | Scalzi et al. |
| 5,896,068 A | 4/1999 | Moyal |
| 5,896,330 A | 4/1999 | Gibson |
| 5,898,345 A | 4/1999 | Namura et al. |
| 5,900,780 A | 5/1999 | Hirose et al. |
| 5,901,062 A | 5/1999 | Burch et al. |
| 5,903,718 A | 5/1999 | Marik |
| 5,905,398 A | 5/1999 | Todsen et al. |
| 5,909,544 A | 6/1999 | Anderson et al. |
| 5,911,059 A | 6/1999 | Profit, Jr. |
| 5,914,465 A | 6/1999 | Allen et al. |
| 5,914,633 A | 6/1999 | Comino et al. |
| 5,914,708 A | 6/1999 | Lagrange et al. |
| 5,917,356 A | 6/1999 | Casal et al. |
| 5,920,310 A | 7/1999 | Faggin et al. |
| 5,923,264 A | 7/1999 | Lavelle et al. |
| 5,926,566 A | 7/1999 | Wang et al. |
| 5,929,710 A | 7/1999 | Bien |
| 5,930,148 A | 7/1999 | Bjorksten et al. |
| 5,930,150 A | 7/1999 | Cohen et al. |
| 5,931,959 A | 8/1999 | Kwiat |
| 5,933,023 A | 8/1999 | Young |
| 5,933,356 A | 8/1999 | Rostoker et al. |
| 5,933,816 A | 8/1999 | Zeanah et al. |
| 5,935,233 A | 8/1999 | Jeddeloh |
| 5,935,266 A | 8/1999 | Thurnhofer et al. |
| 5,939,904 A | 8/1999 | Fetterman et al. |
| 5,939,949 A | 8/1999 | Olgaard et al. |
| 5,941,991 A | 8/1999 | Kageshima |
| 5,942,733 A | 8/1999 | Allen et al. |
| 5,943,052 A | 8/1999 | Allen et al. |
| 5,945,878 A | 8/1999 | Westwick et al. |
| 5,949,632 A | 9/1999 | Barreras, Sr. et al. |
| 5,952,888 A | 9/1999 | Scott |
| 5,956,279 A | 9/1999 | Mo et al. |
| 5,959,871 A | 9/1999 | Pierzchala et al. |
| 5,963,075 A | 10/1999 | Hiiragizawa |
| 5,963,105 A | 10/1999 | Nguyen |
| 5,963,503 A | 10/1999 | Lee |
| 5,964,893 A | 10/1999 | Circello et al. |
| 5,966,027 A | 10/1999 | Kapusta et al. |
| 5,966,532 A | 10/1999 | Mcdonald et al. |
| 5,968,135 A | 10/1999 | Teramoto et al. |
| 5,969,513 A | 10/1999 | Clark |
| 5,969,632 A | 10/1999 | Diamant et al. |
| 5,973,368 A | 10/1999 | Pearce et al. |
| 5,974,235 A | 10/1999 | Nunally et al. |
| 5,977,791 A | 11/1999 | Veenstra |
| 5,978,584 A | 11/1999 | Nishibata et al. |
| 5,978,937 A | 11/1999 | Miyamori et al. |
| 5,982,105 A | 11/1999 | Masters |
| 5,982,229 A | 11/1999 | Wong et al. |
| 5,982,241 A | 11/1999 | Nguyen et al. |
| 5,983,277 A | 11/1999 | Heile et al. |
| 5,986,479 A | 11/1999 | Mohan |
| 5,987,246 A | 11/1999 | Thomsen et al. |
| 5,988,902 A | 11/1999 | Holehan |
| 5,994,939 A | 11/1999 | Johnson et al. |
| 5,996,032 A | 11/1999 | Baker |
| 5,999,725 A | 12/1999 | Barbier et al. |
| 6,002,268 A | 12/1999 | Sasaki et al. |
| 6,002,398 A | 12/1999 | Wilson |
| 6,003,054 A | 12/1999 | Oshima et al. |
| 6,003,107 A | 12/1999 | Ranson et al. |
| 6,003,133 A | 12/1999 | Moughanni et al. |
| 6,005,814 A | 12/1999 | Mulholland et al. |
| 6,005,904 A | 12/1999 | Knapp et al. |
| 6,008,685 A | 12/1999 | Kunst |
| 6,008,703 A | 12/1999 | Perrott et al. |
| 6,009,270 A | 12/1999 | Mann |
| 6,009,496 A | 12/1999 | Tsai |
| 6,011,407 A | 1/2000 | New |
| 6,012,835 A | 1/2000 | Thompson et al. |
| 6,014,135 A | 1/2000 | Fernandes |
| 6,014,509 A | 1/2000 | Furtek et al. |
| 6,014,723 A | 1/2000 | Tremblay et al. |
| 6,016,554 A | 1/2000 | Skrovan et al. |
| 6,016,563 A | 1/2000 | Fleisher |
| 6,018,559 A | 1/2000 | Azegami et al. |
| 6,023,422 A | 2/2000 | Allen et al. |
| 6,023,565 A | 2/2000 | Lawman et al. |
| 6,026,134 A | 2/2000 | Duffy et al. |
| 6,026,501 A | 2/2000 | Hohl et al. |
| 6,028,271 A | 2/2000 | Gillespie et al. |
| 6,028,959 A | 2/2000 | Wang et al. |
| 6,031,365 A | 2/2000 | Sharpe-Geisler |
| 6,032,268 A | 2/2000 | Swoboda et al. |
| 6,034,538 A | 3/2000 | Abramovici |
| 6,035,320 A | 3/2000 | Kiriaki et al. |
| 6,037,807 A | 3/2000 | Wu et al. |
| 6,038,551 A | 3/2000 | Barlow et al. |
| 6,040,707 A | 3/2000 | Young et al. |

(56) References Cited

U.S. PATENT DOCUMENTS

| | | |
|---|---|---|
| 6,041,406 A | 3/2000 | Mann |
| 6,043,695 A | 3/2000 | O'Sullivan |
| 6,043,719 A | 3/2000 | Lin et al. |
| 6,049,223 A | 4/2000 | Lytle et al. |
| 6,049,225 A | 4/2000 | Huang et al. |
| 6,051,772 A | 4/2000 | Cameron et al. |
| 6,052,035 A | 4/2000 | Nolan et al. |
| 6,052,524 A | 4/2000 | Pauna |
| 6,055,584 A | 4/2000 | Bridges et al. |
| 6,057,705 A | 5/2000 | Wojewoda et al. |
| 6,058,263 A | 5/2000 | Voth |
| 6,058,452 A | 5/2000 | Rangasayee et al. |
| 6,061,511 A | 5/2000 | Marantz et al. |
| 6,066,961 A | 5/2000 | Lee et al. |
| 6,070,003 A | 5/2000 | Gove et al. |
| 6,072,803 A | 6/2000 | Allmond et al. |
| 6,075,941 A | 6/2000 | Itoh et al. |
| 6,078,736 A * | 6/2000 | Guccione ............ G06F 17/5054 716/117 |
| 6,078,741 A * | 6/2000 | Ma et al. .......................... 703/24 |
| 6,079,985 A | 6/2000 | Wohl et al. |
| 6,081,140 A | 6/2000 | King |
| 6,094,730 A | 7/2000 | Lopez et al. |
| 6,097,211 A | 8/2000 | Couts-Martin et al. |
| 6,097,432 A | 8/2000 | Mead et al. |
| 6,101,457 A | 8/2000 | Barch et al. |
| 6,101,617 A | 8/2000 | Burckhartt et al. |
| 6,104,217 A | 8/2000 | Magana |
| 6,104,325 A | 8/2000 | Liaw et al. |
| 6,107,769 A | 8/2000 | Saylor et al. |
| 6,107,826 A | 8/2000 | Young et al. |
| 6,107,882 A | 8/2000 | Gabara et al. |
| 6,110,223 A | 8/2000 | Southgate et al. |
| 6,111,431 A | 8/2000 | Estrada |
| 6,112,264 A | 8/2000 | Beasley et al. |
| 6,121,791 A | 9/2000 | Abbott |
| 6,121,805 A | 9/2000 | Thamsirianunt et al. |
| 6,121,965 A | 9/2000 | Kenney et al. |
| 6,125,416 A | 9/2000 | Warren |
| 6,130,548 A | 10/2000 | Koifman |
| 6,130,551 A | 10/2000 | Agrawal et al. |
| 6,130,552 A | 10/2000 | Jefferson et al. |
| 6,133,773 A | 10/2000 | Garlepp et al. |
| 6,134,181 A | 10/2000 | Landry |
| 6,134,516 A | 10/2000 | Wang et al. |
| 6,137,308 A | 10/2000 | Nayak |
| 6,140,853 A | 10/2000 | Lo |
| 6,141,007 A | 10/2000 | Lebling et al. |
| 6,141,376 A | 10/2000 | Shaw |
| 6,141,764 A | 10/2000 | Ezell |
| 6,144,327 A | 11/2000 | Distinti et al. |
| 6,148,104 A | 11/2000 | Wang et al. |
| 6,148,441 A | 11/2000 | Woodward |
| 6,149,299 A | 11/2000 | Aslan et al. |
| 6,150,866 A | 11/2000 | Eto et al. |
| 6,154,064 A | 11/2000 | Proebsting |
| 6,157,024 A | 12/2000 | Chapdelaine et al. |
| 6,157,270 A | 12/2000 | Tso |
| 6,161,199 A | 12/2000 | Szeto et al. |
| 6,166,367 A | 12/2000 | Cho |
| 6,166,960 A | 12/2000 | Marneweck et al. |
| 6,167,077 A | 12/2000 | Ducaroir et al. |
| 6,167,364 A | 12/2000 | Stellenberg et al. |
| 6,167,559 A | 12/2000 | Furtek et al. |
| 6,169,383 B1 | 1/2001 | Johnson |
| 6,172,428 B1 | 1/2001 | Jordan |
| 6,172,571 B1 | 1/2001 | Moyal et al. |
| 6,173,419 B1 | 1/2001 | Barnett |
| 6,175,914 B1 | 1/2001 | Mann |
| 6,175,949 B1 | 1/2001 | Gristede et al. |
| 6,181,163 B1 | 1/2001 | Agrawal et al. |
| 6,183,131 B1 | 2/2001 | Holloway et al. |
| 6,185,127 B1 | 2/2001 | Myers et al. |
| 6,185,522 B1 | 2/2001 | Bakker |
| 6,185,703 B1 | 2/2001 | Guddat et al. |
| 6,185,732 B1 | 2/2001 | Mann et al. |
| 6,188,228 B1 | 2/2001 | Philipp |
| 6,188,241 B1 | 2/2001 | Gauthier et al. |
| 6,188,381 B1 | 2/2001 | Van Der et al. |
| 6,188,391 B1 | 2/2001 | Seely et al. |
| 6,188,975 B1 | 2/2001 | Gay |
| 6,191,603 B1 | 2/2001 | Muradali et al. |
| 6,191,660 B1 | 2/2001 | Mar et al. |
| 6,191,998 B1 | 2/2001 | Reddy et al. |
| 6,192,431 B1 | 2/2001 | Dabral et al. |
| 6,198,303 B1 | 3/2001 | Rangasayee |
| 6,201,407 B1 | 3/2001 | Kapusta et al. |
| 6,201,829 B1 | 3/2001 | Schneider |
| 6,202,044 B1 | 3/2001 | Tzori |
| 6,204,687 B1 | 3/2001 | Schultz et al. |
| 6,205,574 B1 | 3/2001 | Dellinger et al. |
| 6,208,572 B1 | 3/2001 | Adams et al. |
| 6,211,708 B1 | 4/2001 | Klemmer |
| 6,211,715 B1 | 4/2001 | Terauchi |
| 6,211,741 B1 | 4/2001 | Dalmia |
| 6,215,352 B1 | 4/2001 | Sudo |
| 6,216,254 B1 | 4/2001 | Pesce et al. |
| 6,219,729 B1 | 4/2001 | Keats et al. |
| 6,222,528 B1 | 4/2001 | Gerpheide et al. |
| 6,223,144 B1 | 4/2001 | Barnett et al. |
| 6,223,147 B1 | 4/2001 | Bowers |
| 6,223,272 B1 | 4/2001 | Coehlo et al. |
| RE37,195 E | 5/2001 | Kean |
| 6,225,866 B1 | 5/2001 | Kubota et al. |
| 6,225,992 B1 | 5/2001 | Hsu et al. |
| 6,236,242 B1 | 5/2001 | Hedberg |
| 6,236,275 B1 | 5/2001 | Dent |
| 6,236,278 B1 | 5/2001 | Olgaard |
| 6,236,593 B1 | 5/2001 | Hong et al. |
| 6,239,389 B1 | 5/2001 | Allen et al. |
| 6,239,798 B1 | 5/2001 | Ludolph et al. |
| 6,240,375 B1 | 5/2001 | Sonoda |
| 6,246,258 B1 | 6/2001 | Lesea |
| 6,246,410 B1 | 6/2001 | Bergeron et al. |
| 6,249,167 B1 | 6/2001 | Oguchi et al. |
| 6,249,447 B1 | 6/2001 | Boylan et al. |
| 6,253,250 B1 | 6/2001 | Evans et al. |
| 6,256,754 B1 | 7/2001 | Roohparvar |
| 6,262,717 B1 | 7/2001 | Donohue et al. |
| 6,263,302 B1 | 7/2001 | Hellestrand et al. |
| 6,263,339 B1 | 7/2001 | Hirsch |
| 6,263,484 B1 | 7/2001 | Yang |
| 6,271,679 B1 | 8/2001 | Mcclintock et al. |
| 6,272,646 B1 | 8/2001 | Rangasayee et al. |
| 6,275,117 B1 | 8/2001 | Abugharbieh et al. |
| 6,278,568 B1 | 8/2001 | Cloke et al. |
| 6,280,391 B1 | 8/2001 | Olson et al. |
| 6,281,753 B1 | 8/2001 | Corsi et al. |
| 6,282,547 B1 | 8/2001 | Hirsch |
| 6,282,551 B1 | 8/2001 | Anderson et al. |
| 6,286,127 B1 | 9/2001 | King et al. |
| 6,288,707 B1 | 9/2001 | Philipp |
| 6,289,300 B1 | 9/2001 | Brannick et al. |
| 6,289,478 B1 | 9/2001 | Kitagaki |
| 6,289,489 B1 | 9/2001 | Bold et al. |
| 6,292,028 B1 | 9/2001 | Tomita |
| 6,294,932 B1 | 9/2001 | Watarai |
| 6,294,962 B1 | 9/2001 | Mar |
| 6,298,320 B1 | 10/2001 | Buckmaster et al. |
| 6,304,014 B1 | 10/2001 | England et al. |
| 6,304,101 B1 | 10/2001 | Nishihara |
| 6,304,790 B1 | 10/2001 | Nakamura et al. |
| 6,307,413 B1 | 10/2001 | Dalmia et al. |
| 6,310,521 B1 | 10/2001 | Dalmia |
| 6,310,611 B1 | 10/2001 | Caldwell |
| 6,311,149 B1 | 10/2001 | Ryan et al. |
| 6,314,530 B1 | 11/2001 | Mann |
| 6,320,184 B1 | 11/2001 | Winklhofer et al. |
| 6,320,282 B1 | 11/2001 | Caldwell |
| 6,321,369 B1 | 11/2001 | Heile et al. |
| 6,323,846 B1 | 11/2001 | Westerman et al. |
| 6,324,628 B1 | 11/2001 | Chan |
| 6,326,859 B1 | 12/2001 | Goldman et al. |
| 6,332,137 B1 | 12/2001 | Hori et al. |

(56) References Cited

U.S. PATENT DOCUMENTS

| | | |
|---|---|---|
| 6,332,201 B1 | 12/2001 | Chin et al. |
| 6,337,579 B1 | 1/2002 | Mochida |
| 6,338,109 B1 | 1/2002 | Snyder et al. |
| 6,339,815 B1 | 1/2002 | Feng et al. |
| 6,342,907 B1 | 1/2002 | Petty et al. |
| 6,345,383 B1 | 2/2002 | Ueki |
| 6,347,395 B1 | 2/2002 | Payne et al. |
| 6,351,789 B1 | 2/2002 | Green |
| 6,353,452 B1 | 3/2002 | Hamada et al. |
| 6,355,980 B1 | 3/2002 | Callahan |
| 6,356,862 B2 | 3/2002 | Bailey |
| 6,356,958 B1 | 3/2002 | Lin |
| 6,356,960 B1 | 3/2002 | Jones et al. |
| 6,359,950 B2 | 3/2002 | Gossmann et al. |
| 6,362,697 B1 | 3/2002 | Pulvirenti |
| 6,366,174 B1 | 4/2002 | Berry et al. |
| 6,366,300 B1 | 4/2002 | Ohara et al. |
| 6,366,874 B1 | 4/2002 | Lee et al. |
| 6,366,878 B1 | 4/2002 | Grunert |
| 6,369,660 B1 | 4/2002 | Wei et al. |
| 6,371,878 B1 | 4/2002 | Bowen |
| 6,373,954 B1 | 4/2002 | Malcolm, Jr. et al. |
| 6,374,370 B1 | 4/2002 | Bockhaus et al. |
| 6,377,009 B1 | 4/2002 | Philipp |
| 6,377,575 B1 | 4/2002 | Mullaney et al. |
| 6,377,646 B1 | 4/2002 | Sha |
| 6,380,811 B1 | 4/2002 | Zarubinsky et al. |
| 6,380,929 B1 | 4/2002 | Platt |
| 6,380,931 B1 | 4/2002 | Gillespie et al. |
| 6,384,947 B1 | 5/2002 | Ackerman et al. |
| 6,385,742 B1 | 5/2002 | Kirsch et al. |
| 6,388,109 B1 | 5/2002 | Schwarz et al. |
| 6,388,464 B1 | 5/2002 | Lacey et al. |
| 6,396,302 B2 | 5/2002 | New et al. |
| 6,396,657 B1 | 5/2002 | Suzuki |
| 6,397,232 B1 | 5/2002 | Cheng-Hung et al. |
| 6,401,230 B1 | 6/2002 | Ahanessians et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,421,817 B1 | 7/2002 | Mohan et al. |
| 6,425,109 B1 | 7/2002 | Choukalos et al. |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard et al. |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 * | 10/2002 | Insenser Farre et al. ...... 326/38 |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Bergamashi et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,969 B2 | 12/2002 | Feng et al. |
| 6,496,971 B1 | 12/2002 | Lesea et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | Mcdonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,546,297 B1 * | 4/2003 | Gaston et al. ............... 700/83 |
| 6,552,933 B2 | 4/2003 | Roohparvar |
| 6,553,057 B1 | 4/2003 | Sha et al. |
| 6,554,469 B1 | 4/2003 | Thomson et al. |
| 6,556,044 B2 | 4/2003 | Langhammer et al. |
| 6,557,156 B1 * | 4/2003 | Guccione ............ G06F 17/5054 716/117 |
| 6,557,164 B1 | 4/2003 | Faustini |
| 6,559,685 B2 | 5/2003 | Green |
| 6,560,306 B1 | 5/2003 | Duffy et al. |
| 6,560,699 B1 | 5/2003 | Konkle |
| 6,563,391 B1 | 5/2003 | Mar |
| 6,564,179 B1 | 5/2003 | Belhaj |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,590,589 B1 | 7/2003 | Sluiman et al. |
| 6,591,369 B1 | 7/2003 | Edwards et al. |
| 6,592,626 B1 | 7/2003 | Bauchot et al. |
| 6,594,796 B1 | 7/2003 | Chiang |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |

(56) References Cited

U.S. PATENT DOCUMENTS

| | | | |
|---|---|---|---|
| 6,604,179 | B2 | 8/2003 | Volk et al. |
| 6,606,731 | B1 | 8/2003 | Baum et al. |
| 6,608,472 | B1 | 8/2003 | Kutz et al. |
| 6,610,936 | B2 | 8/2003 | Gillespie et al. |
| 6,611,220 | B1 | 8/2003 | Snyder |
| 6,611,276 | B1 | 8/2003 | Muratori et al. |
| 6,611,856 | B1 | 8/2003 | Liao et al. |
| 6,611,952 | B1 | 8/2003 | Prakash et al. |
| 6,613,098 | B1 | 9/2003 | Sorge et al. |
| 6,614,260 | B1 | 9/2003 | Welch et al. |
| 6,614,320 | B1 | 9/2003 | Sullam et al. |
| 6,614,374 | B1 | 9/2003 | Gustavsson et al. |
| 6,614,458 | B1 | 9/2003 | Lambert et al. |
| 6,615,167 | B1 | 9/2003 | Devins et al. |
| 6,617,888 | B2 | 9/2003 | Volk |
| 6,618,854 | B1 | 9/2003 | Mann |
| 6,621,356 | B2 | 9/2003 | Gotz et al. |
| 6,624,640 | B2 | 9/2003 | Lund et al. |
| 6,625,765 | B1 | 9/2003 | Krishnan |
| 6,628,163 | B2 | 9/2003 | Dathe et al. |
| 6,628,311 | B1 | 9/2003 | Fang |
| 6,631,508 | B1 | 10/2003 | Williams |
| 6,634,008 | B1 | 10/2003 | Dole |
| 6,634,009 | B1 | 10/2003 | Molson et al. |
| 6,636,096 | B2 | 10/2003 | Schaffer et al. |
| 6,636,169 | B1 | 10/2003 | Distinti et al. |
| 6,637,015 | B1 | 10/2003 | Ogami et al. |
| 6,639,586 | B2 | 10/2003 | Gerpheide |
| 6,642,857 | B1 | 11/2003 | Schediwy et al. |
| 6,643,151 | B1 | 11/2003 | Nebrigic et al. |
| 6,643,810 | B2 | 11/2003 | Whetsel |
| 6,649,924 | B1 | 11/2003 | Philipp et al. |
| 6,650,581 | B2 | 11/2003 | Hong et al. |
| 6,658,498 | B1 | 12/2003 | Carney et al. |
| 6,658,633 | B2 | 12/2003 | Devins et al. |
| 6,661,288 | B2 | 12/2003 | Morgan et al. |
| 6,661,410 | B2 | 12/2003 | Casebolt et al. |
| 6,661,724 | B1 | 12/2003 | Snyder et al. |
| 6,664,978 | B1 | 12/2003 | Kekic et al. |
| 6,664,991 | B1 | 12/2003 | Chew et al. |
| 6,667,642 | B1 | 12/2003 | Moyal |
| 6,667,740 | B2 | 12/2003 | Ely et al. |
| 6,670,852 | B1 | 12/2003 | Hauck |
| 6,671,869 | B2 * | 12/2003 | Davidson et al. ............ 716/117 |
| 6,673,308 | B2 | 1/2004 | Hino et al. |
| 6,677,814 | B2 | 1/2004 | Low et al. |
| 6,677,932 | B1 | 1/2004 | Westerman |
| 6,678,645 | B1 | 1/2004 | Rajsuman et al. |
| 6,678,877 | B1 | 1/2004 | Perry et al. |
| 6,680,632 | B1 | 1/2004 | Meyers et al. |
| 6,680,731 | B2 | 1/2004 | Gerpheide et al. |
| 6,681,280 | B1 | 1/2004 | Miyake et al. |
| 6,681,359 | B1 | 1/2004 | Au et al. |
| 6,683,462 | B2 | 1/2004 | Shimizu |
| 6,683,930 | B1 | 1/2004 | Dalmia |
| 6,686,787 | B2 | 2/2004 | Ling |
| 6,686,860 | B2 | 2/2004 | Gulati et al. |
| 6,690,224 | B1 | 2/2004 | Moore |
| 6,691,193 | B1 | 2/2004 | Wang et al. |
| 6,691,301 | B2 | 2/2004 | Bowen |
| 6,697,754 | B1 | 2/2004 | Alexander |
| 6,701,340 | B1 | 3/2004 | Gorecki et al. |
| 6,701,487 | B1 | 3/2004 | Ogami et al. |
| 6,701,508 | B1 | 3/2004 | Bartz et al. |
| 6,703,961 | B2 | 3/2004 | Mueck et al. |
| 6,704,381 | B1 | 3/2004 | Moyal et al. |
| 6,704,879 | B1 | 3/2004 | Parrish |
| 6,704,889 | B2 | 3/2004 | Veenstra et al. |
| 6,704,893 | B1 | 3/2004 | Bauwens et al. |
| 6,705,511 | B1 | 3/2004 | Dames et al. |
| 6,710,788 | B1 | 3/2004 | Freach et al. |
| 6,711,226 | B1 | 3/2004 | Williams et al. |
| 6,711,731 | B2 | 3/2004 | Weiss |
| 6,713,897 | B2 | 3/2004 | Caldwell |
| 6,714,016 | B2 | 3/2004 | Odaohhara et al. |
| 6,714,066 | B2 | 3/2004 | Gorecki et al. |
| 6,714,817 | B2 | 3/2004 | Daynes et al. |
| 6,715,132 | B1 | 3/2004 | Bartz et al. |
| 6,717,474 | B2 | 4/2004 | Chen et al. |
| 6,718,294 | B1 | 4/2004 | Bortfeld |
| 6,718,520 | B1 | 4/2004 | Merryman et al. |
| 6,718,533 | B1 | 4/2004 | Schneider et al. |
| 6,724,220 | B1 * | 4/2004 | Snyder ..................... G06F 1/08 326/38 |
| 6,725,441 | B1 | 4/2004 | Keller et al. |
| 6,728,900 | B1 | 4/2004 | Meli |
| 6,728,902 | B2 | 4/2004 | Kaiser et al. |
| 6,730,863 | B1 | 5/2004 | Gerpheide et al. |
| 6,731,552 | B2 | 5/2004 | Perner |
| 6,732,068 | B2 | 5/2004 | Sample et al. |
| 6,732,347 | B1 | 5/2004 | Camilleri et al. |
| 6,738,858 | B1 | 5/2004 | Fernald et al. |
| 6,744,323 | B1 | 6/2004 | Moyal et al. |
| 6,745,369 | B1 | 6/2004 | May et al. |
| 6,748,569 | B1 | 6/2004 | Brooke et al. |
| 6,750,852 | B2 | 6/2004 | Gillespie et al. |
| 6,750,876 | B1 | 6/2004 | Atsatt et al. |
| 6,750,889 | B1 | 6/2004 | Livingston |
| 6,754,101 | B2 | 6/2004 | Terzioglu et al. |
| 6,754,723 | B2 | 6/2004 | Kato |
| 6,754,765 | B1 | 6/2004 | Chang et al. |
| 6,754,849 | B2 | 6/2004 | Tamura |
| 6,757,882 | B2 | 6/2004 | Chen et al. |
| 6,765,407 | B1 | 7/2004 | Snyder |
| 6,768,337 | B2 | 7/2004 | Kohno et al. |
| 6,768,352 | B1 | 7/2004 | Maher et al. |
| 6,769,622 | B1 | 8/2004 | Tournemille et al. |
| 6,771,552 | B2 | 8/2004 | Fujisawa |
| 6,781,456 | B2 | 8/2004 | Pradhan |
| 6,782,068 | B1 | 8/2004 | Wilson et al. |
| 6,784,821 | B1 | 8/2004 | Lee |
| 6,784,903 | B2 * | 8/2004 | Kodosky et al. .............. 715/771 |
| 6,785,881 | B1 | 8/2004 | Bartz et al. |
| 6,788,116 | B1 | 9/2004 | Cook et al. |
| 6,788,221 | B1 | 9/2004 | Ely et al. |
| 6,791,377 | B2 | 9/2004 | Ilchmann et al. |
| 6,792,584 | B1 | 9/2004 | Eneboe et al. |
| 6,798,218 | B2 | 9/2004 | Kasperkovitz |
| 6,798,299 | B1 | 9/2004 | Mar et al. |
| 6,799,198 | B1 | 9/2004 | Huboi et al. |
| 6,806,771 | B1 | 10/2004 | Hildebrant et al. |
| 6,806,782 | B2 | 10/2004 | Motoyoshi et al. |
| 6,807,109 | B2 | 10/2004 | Tomishima |
| 6,809,275 | B1 | 10/2004 | Cheng et al. |
| 6,809,566 | B1 | 10/2004 | Xin-Leblanc |
| 6,810,442 | B1 | 10/2004 | Lin et al. |
| 6,812,678 | B1 | 11/2004 | Brohlin |
| 6,815,979 | B2 | 11/2004 | Ooshita |
| 6,816,544 | B1 | 11/2004 | Bailey et al. |
| 6,817,005 | B2 | 11/2004 | Mason et al. |
| 6,819,142 | B2 | 11/2004 | Viehmann et al. |
| 6,823,282 | B1 | 11/2004 | Snyder |
| 6,823,497 | B2 | 11/2004 | Schubert et al. |
| 6,825,689 | B1 | 11/2004 | Snyder |
| 6,825,869 | B2 | 11/2004 | Bang |
| 6,828,824 | B2 | 12/2004 | Betz et al. |
| 6,829,727 | B1 | 12/2004 | Pawloski |
| 6,834,384 | B2 | 12/2004 | Fiorella, II et al. |
| 6,836,169 | B2 | 12/2004 | Richmond et al. |
| 6,839,774 | B1 | 1/2005 | Ahn et al. |
| 6,842,710 | B1 | 1/2005 | Gehring et al. |
| 6,847,203 | B1 | 1/2005 | Conti et al. |
| 6,850,117 | B2 | 2/2005 | Weber et al. |
| 6,850,554 | B1 | 2/2005 | Sha et al. |
| 6,853,598 | B2 | 2/2005 | Chevallier |
| 6,854,067 | B1 | 2/2005 | Kutz et al. |
| 6,856,433 | B2 | 2/2005 | Hatano et al. |
| 6,859,884 | B1 | 2/2005 | Sullam |
| 6,862,240 | B2 | 3/2005 | Burgan |
| 6,864,710 | B1 | 3/2005 | Lacey et al. |
| 6,865,429 | B1 | 3/2005 | Schneider et al. |
| 6,865,504 | B2 | 3/2005 | Larson et al. |
| 6,868,500 | B1 | 3/2005 | Kutz et al. |
| 6,871,253 | B2 | 3/2005 | Greeff et al. |

(56) References Cited

U.S. PATENT DOCUMENTS

| | | | |
|---|---|---|---|
| 6,871,331 B1 | 3/2005 | Bloom et al. |
| 6,873,203 B1 | 3/2005 | Latham, II et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,014 B2 | 5/2005 | Son et al. |
| 6,901,563 B1 | 5/2005 | Ogami et al. |
| 6,903,613 B1 | 6/2005 | Mitchell et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Mueller et al. |
| 6,934,674 B1 | 8/2005 | Douezy et al. |
| 6,937,075 B2 | 8/2005 | Lim et al. |
| 6,940,356 B2 | 9/2005 | Mcdonald, II et al. |
| 6,941,336 B1 | 9/2005 | Mar |
| 6,941,356 B2 * | 9/2005 | Meyerson ............... 709/220 |
| 6,941,538 B2 | 9/2005 | Hwang et al. |
| 6,944,018 B2 | 9/2005 | Caldwell |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,961,686 B2 * | 11/2005 | Kodosky et al. ............ 703/2 |
| 6,963,233 B2 | 11/2005 | Puccio et al. |
| 6,963,908 B1 | 11/2005 | Lynch et al. |
| 6,966,039 B1 | 11/2005 | Bartz et al. |
| 6,967,511 B1 | 11/2005 | Sullam |
| 6,967,960 B1 | 11/2005 | Bross et al. |
| 6,968,346 B2 | 11/2005 | Hekmatpour |
| 6,970,844 B1 | 11/2005 | Bierenbaum |
| 6,971,004 B1 | 11/2005 | Pleis et al. |
| 6,973,400 B2 | 12/2005 | Cahill-O'Brien et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,989,659 B2 | 1/2006 | Menegoli et al. |
| 6,996,799 B1 | 2/2006 | Cismas et al. |
| 7,003,732 B2 | 2/2006 | Zhaksilikov |
| 7,005,933 B1 | 2/2006 | Shutt |
| 7,009,444 B1 | 3/2006 | Scott |
| 7,010,773 B1 | 3/2006 | Bartz et al. |
| 7,015,735 B2 | 3/2006 | Kimura et al. |
| 7,017,145 B2 | 3/2006 | Taylor |
| 7,020,854 B2 | 3/2006 | Killian et al. |
| 7,023,257 B1 | 4/2006 | Sullam |
| 7,024,636 B2 | 4/2006 | Weed |
| 7,024,654 B2 | 4/2006 | Bersch et al. |
| 7,030,656 B2 | 4/2006 | Lo et al. |
| 7,030,688 B2 | 4/2006 | Dosho et al. |
| 7,034,603 B2 | 4/2006 | Brady et al. |
| 7,042,301 B2 | 5/2006 | Sutardja |
| 7,047,166 B2 | 5/2006 | Dancea |
| 7,055,035 B2 | 5/2006 | Allison et al. |
| 7,058,921 B1 | 6/2006 | Hwang et al. |
| 7,073,158 B2 | 7/2006 | Mccubbrey |
| 7,076,420 B1 | 7/2006 | Snyder et al. |
| 7,079,166 B1 | 7/2006 | Hong |
| 7,082,584 B2 | 7/2006 | Lahner et al. |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,099,818 B1 | 8/2006 | Nemecek et al. |
| 7,100,133 B1 | 8/2006 | Meiyappan et al. |
| 7,100,139 B1 | 8/2006 | Anderson et al. |
| 7,103,108 B1 | 9/2006 | Beard |
| 7,113,090 B1 | 9/2006 | Saylor et al. |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,138,841 B1 | 11/2006 | Li et al. |
| 7,138,868 B2 | 11/2006 | Sanchez et al. |
| 7,139,530 B2 | 11/2006 | Kusbel |
| 7,139,999 B2 | 11/2006 | Bowman-Amuah |
| 7,143,360 B1 | 11/2006 | Ogami et al. |
| 7,149,316 B1 | 12/2006 | Kutz et al. |
| 7,150,002 B1 | 12/2006 | Anderson et al. |
| 7,152,027 B2 * | 12/2006 | Andrade et al. ............... 703/21 |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,171,455 B1 | 1/2007 | Gupta et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,199,783 B2 | 4/2007 | Wenstrand et al. |
| 7,200,507 B2 | 4/2007 | Chen et al. |
| 7,206,733 B1 | 4/2007 | Nemecek |
| 7,219,306 B2 * | 5/2007 | Kodosky et al. ............ 715/763 |
| 7,221,187 B1 * | 5/2007 | Snyder ............ G06F 1/08 326/41 |
| 7,227,389 B2 | 6/2007 | Gong et al. |
| 7,236,921 B1 | 6/2007 | Nemecek et al. |
| 7,250,825 B2 | 7/2007 | Wilson et al. |
| 7,256,588 B2 | 8/2007 | Howard et al. |
| 7,265,633 B1 | 9/2007 | Stiff |
| 7,266,768 B2 | 9/2007 | Ferlitsch et al. |
| 7,281,846 B2 | 10/2007 | Mcleod |
| 7,282,905 B2 | 10/2007 | Chen et al. |
| 7,283,151 B2 | 10/2007 | Nihei et al. |
| 7,283,410 B2 | 10/2007 | Hsu et al. |
| 7,287,112 B1 | 10/2007 | Pleis et al. |
| 7,290,244 B2 | 10/2007 | Peck et al. |
| 7,295,049 B1 | 11/2007 | Moyal et al. |
| 7,299,307 B1 | 11/2007 | Early et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,319,999 B2 | 1/2008 | Evans |
| 7,323,879 B2 | 1/2008 | Kuo et al. |
| 7,324,380 B2 | 1/2008 | Negut et al. |
| 7,332,976 B1 | 2/2008 | Brennan |
| 7,337,339 B1 | 2/2008 | Choquette et al. |
| 7,337,407 B1 | 2/2008 | Ogami et al. |
| 7,342,405 B2 | 3/2008 | Eldridge et al. |
| 7,348,861 B1 | 3/2008 | Wu et al. |
| 7,353,415 B2 | 4/2008 | Zaretsky et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,391,204 B2 | 6/2008 | Bicking |
| 7,392,011 B1 | 6/2008 | Jacomb-Hood |
| 7,397,226 B1 | 7/2008 | Mannama et al. |

(56) References Cited

U.S. PATENT DOCUMENTS

| | | | |
|---|---|---|---|
| 7,400,183 B1 | 7/2008 | Sivadasan et al. | |
| 7,406,674 B1 | 7/2008 | Ogami et al. | |
| 7,418,608 B2 | 8/2008 | Kumar et al. | |
| 7,421,251 B2 | 9/2008 | Westwick et al. | |
| 7,437,692 B2 | 10/2008 | Oberlaender | |
| 7,461,274 B2 | 12/2008 | Merkin | |
| 7,542,533 B2 | 6/2009 | Jasa et al. | |
| 7,554,847 B2 | 6/2009 | Lee | |
| 7,616,509 B2 | 11/2009 | Qureshi et al. | |
| 7,650,264 B2 * | 1/2010 | Kodosky et al. | 703/2 |
| 7,702,928 B2 | 4/2010 | Schumacher et al. | |
| 7,739,629 B2 | 6/2010 | Wang et al. | |
| 7,809,545 B2 * | 10/2010 | Ciolfi et al. | 703/22 |
| 7,825,688 B1 * | 11/2010 | Snyder | G06F 1/08 326/39 |
| 8,065,653 B1 | 11/2011 | Best et al. | |
| 8,078,894 B1 | 12/2011 | Ogami | |
| 8,085,020 B1 | 12/2011 | Bennett | |
| 8,164,365 B2 | 4/2012 | Wright et al. | |
| 8,244,806 B2 * | 8/2012 | Arthur | G06F 11/3664 709/204 |
| 8,266,575 B1 | 9/2012 | Ogami et al. | |
| 8,499,270 B1 | 7/2013 | Best et al. | |
| 8,527,949 B1 | 9/2013 | Pleis et al. | |
| 8,533,677 B1 | 9/2013 | Pleis et al. | |
| 8,661,400 B1 | 2/2014 | Ogami et al. | |
| 8,788,959 B1 | 7/2014 | Ogami et al. | |
| 8,909,960 B1 | 12/2014 | Ogami | |
| 2001/0002129 A1 | 5/2001 | Zimmerman et al. | |
| 2001/0010083 A1 | 7/2001 | Satoh | |
| 2001/0021985 A1 | 9/2001 | Aldridge et al. | |
| 2001/0038392 A1 | 11/2001 | Humpleman et al. | |
| 2001/0043081 A1 | 11/2001 | Rees | |
| 2001/0044927 A1 | 11/2001 | Karniewicz | |
| 2001/0045861 A1 | 11/2001 | Bloodworth et al. | |
| 2001/0047509 A1 | 11/2001 | Mason et al. | |
| 2002/0010716 A1 | 1/2002 | Mccartney et al. | |
| 2002/0016706 A1 | 2/2002 | Cooke et al. | |
| 2002/0023110 A1 | 2/2002 | Fortin et al. | |
| 2002/0035618 A1 | 3/2002 | Mendez et al. | |
| 2002/0042696 A1 | 4/2002 | Garcia et al. | |
| 2002/0052729 A1 | 5/2002 | Kyung et al. | |
| 2002/0052941 A1 | 5/2002 | Patterson | |
| 2002/0055834 A1 | 5/2002 | Andrade et al. | |
| 2002/0059543 A1 | 5/2002 | Cheng et al. | |
| 2002/0063688 A1 | 5/2002 | Shaw et al. | |
| 2002/0065646 A1 | 5/2002 | Waldie et al. | |
| 2002/0068989 A1 | 6/2002 | Ebisawa et al. | |
| 2002/0073119 A1 | 6/2002 | Richard | |
| 2002/0073380 A1 | 6/2002 | Cooke | |
| 2002/0080186 A1 | 6/2002 | Frederiksen | |
| 2002/0085020 A1 | 7/2002 | Carroll | |
| 2002/0099863 A1 | 7/2002 | Comeau et al. | |
| 2002/0109722 A1 | 8/2002 | Rogers et al. | |
| 2002/0116168 A1 | 8/2002 | Kim | |
| 2002/0121679 A1 | 9/2002 | Bazarjani et al. | |
| 2002/0122060 A1 | 9/2002 | Markel | |
| 2002/0129334 A1 | 9/2002 | Dane et al. | |
| 2002/0133771 A1 | 9/2002 | Barnett | |
| 2002/0133794 A1 | 9/2002 | Kanapathippillai et al. | |
| 2002/0138516 A1 | 9/2002 | Igra | |
| 2002/0144099 A1 | 10/2002 | Muro et al. | |
| 2002/0145433 A1 | 10/2002 | Morrise et al. | |
| 2002/0152234 A1 | 10/2002 | Estrada et al. | |
| 2002/0152449 A1 | 10/2002 | Lin | |
| 2002/0156885 A1 | 10/2002 | Thakkar | |
| 2002/0156929 A1 | 10/2002 | Hekmatpour | |
| 2002/0156998 A1 | 10/2002 | Casselman | |
| 2002/0161802 A1 | 10/2002 | Gabrick et al. | |
| 2002/0166100 A1 | 11/2002 | Meding | |
| 2002/0170050 A1 | 11/2002 | Fiorella et al. | |
| 2002/0174134 A1 | 11/2002 | Goykhman | |
| 2002/0174411 A1 | 11/2002 | Feng et al. | |
| 2002/0183956 A1 | 12/2002 | Nightingale | |
| 2002/0188910 A1 | 12/2002 | Zizzo | |
| 2002/0191029 A1 | 12/2002 | Gillespie et al. | |
| 2003/0011639 A1 | 1/2003 | Webb | |
| 2003/0014447 A1 | 1/2003 | White | |
| 2003/0025734 A1 | 2/2003 | Boose et al. | |
| 2003/0033588 A1 | 2/2003 | Alexander | |
| 2003/0038842 A1 | 2/2003 | Peck et al. | |
| 2003/0041235 A1 | 2/2003 | Meyer | |
| 2003/0046657 A1 | 3/2003 | White | |
| 2003/0056071 A1 | 3/2003 | Triece et al. | |
| 2003/0058469 A1 | 3/2003 | Buis et al. | |
| 2003/0061572 A1 | 3/2003 | McClannahan et al. | |
| 2003/0062889 A1 | 4/2003 | Ely et al. | |
| 2003/0066057 A1 | 4/2003 | Rudusky | |
| 2003/0080755 A1 | 5/2003 | Kobayashi | |
| 2003/0086300 A1 | 5/2003 | Noyes et al. | |
| 2003/0088852 A1 | 5/2003 | Lacas et al. | |
| 2003/0097640 A1 | 5/2003 | Abrams et al. | |
| 2003/0105620 A1 | 6/2003 | Bowen | |
| 2003/0110464 A1 | 6/2003 | Davidson et al. | |
| 2003/0126947 A1 | 7/2003 | Margaria | |
| 2003/0135842 A1 | 7/2003 | Frey et al. | |
| 2003/0149961 A1 | 8/2003 | Kawai et al. | |
| 2003/0163798 A1 | 8/2003 | Hwang et al. | |
| 2003/0229482 A1 | 12/2003 | Cook et al. | |
| 2003/0233631 A1 | 12/2003 | Curry et al. | |
| 2004/0018711 A1 | 1/2004 | Madurawe | |
| 2004/0031030 A1 | 2/2004 | Kidder et al. | |
| 2004/0054821 A1 | 3/2004 | Warren et al. | |
| 2004/0145551 A1 | 7/2004 | Tobita | |
| 2004/0153802 A1 | 8/2004 | Kudo et al. | |
| 2004/0201627 A1 | 10/2004 | Maddocks et al. | |
| 2004/0205553 A1 | 10/2004 | Hall et al. | |
| 2004/0205617 A1 | 10/2004 | Light | |
| 2004/0205695 A1 | 10/2004 | Fletcher | |
| 2004/0217799 A1 | 11/2004 | Ichihara | |
| 2004/0221249 A1 | 11/2004 | Lahner et al. | |
| 2004/0250231 A1 | 12/2004 | Killian et al. | |
| 2005/0015632 A1 | 1/2005 | Chheda et al. | |
| 2005/0024341 A1 | 2/2005 | Gillespie et al. | |
| 2005/0057482 A1 | 3/2005 | Youngblood et al. | |
| 2005/0066152 A1 | 3/2005 | Garey | |
| 2005/0140659 A1 | 6/2005 | Hohl et al. | |
| 2005/0143968 A9 | 6/2005 | Odom et al. | |
| 2005/0237304 A1 | 10/2005 | Anandakumar et al. | |
| 2005/0240917 A1 | 10/2005 | Wu | |
| 2005/0248534 A1 | 11/2005 | Kehlstadt | |
| 2005/0280453 A1 | 12/2005 | Hsieh | |
| 2006/0015862 A1 | 1/2006 | Odom et al. | |
| 2006/0031768 A1 | 2/2006 | Shah et al. | |
| 2006/0032680 A1 | 2/2006 | Elias et al. | |
| 2006/0097991 A1 | 5/2006 | Hotelling et al. | |
| 2006/0150149 A1 | 7/2006 | Chandhoke et al. | |
| 2006/0271804 A1 | 11/2006 | Alperin et al. | |
| 2006/0273804 A1 | 12/2006 | Delorme et al. | |
| 2007/0050644 A1 | 3/2007 | Merkin | |
| 2007/0139074 A1 | 6/2007 | Reblewski | |
| 2007/0139338 A1 | 6/2007 | Lin et al. | |
| 2007/0258458 A1 | 11/2007 | Kapoor | |
| 2008/0086668 A1 * | 4/2008 | Jefferson et al. | 714/741 |
| 2008/0095213 A1 | 4/2008 | Lin et al. | |
| 2008/0131145 A1 | 6/2008 | Tao et al. | |
| 2008/0178143 A1 | 7/2008 | Dougan et al. | |
| 2008/0186052 A1 | 8/2008 | Needham et al. | |
| 2008/0259017 A1 | 10/2008 | Wright et al. | |
| 2008/0259998 A1 | 10/2008 | Venkataraman et al. | |
| 2008/0294806 A1 | 11/2008 | Swindle et al. | |
| 2009/0054129 A1 | 2/2009 | Yoshimura et al. | |
| 2009/0066427 A1 | 3/2009 | Brennan | |
| 2009/0322305 A1 | 12/2009 | De | |
| 2010/0023865 A1 | 1/2010 | Fulker et al. | |
| 2011/0234264 A1 | 9/2011 | Wright et al. | |
| 2011/0248692 A1 | 10/2011 | Shehu et al. | |

FOREIGN PATENT DOCUMENTS

| | | |
|---|---|---|
| EP | 368398 A1 | 5/1990 |
| EP | 0450863 A | 10/1991 |
| EP | 0499383 A | 8/1992 |
| EP | 0639816 A2 | 2/1995 |

(56) References Cited

FOREIGN PATENT DOCUMENTS

| | | | |
|---|---|---|---|
| EP | 1170671 | A | 1/2002 |
| EP | 1191423 | A | 3/2002 |
| EP | 1205848 | A1 | 5/2002 |
| JP | 4083405 | A | 3/1992 |
| JP | 4095408 | A | 3/1992 |
| JP | 5041651 | A | 2/1993 |
| JP | 5055842 | A | 3/1993 |
| JP | 6021732 | A | 1/1994 |
| WO | 9532478 | A | 11/1995 |
| WO | PCTUS9617305 | A1 | 6/1996 |
| WO | PCTUS9834376 | A1 | 8/1998 |
| WO | PCTUS9909712 | A1 | 2/1999 |

OTHER PUBLICATIONS

Zorian, "Test Requirements for Embedded Core-based Systems and IEEE P1500," IEEE, 1997; 9 pages.
Shahbahrami et al., "Matrix Register File and Extended Subwords: Two Techniques for Embedded Media Processors," ACM, May 2005; 9 pages.
Snyder et al., "Xilinx's A-to-Z Systems Platform" Cahners Microprocessor, The Insider's Guide to Microprocessor Hardware, Feb. 6, 2001; 9 pages.
Song et al., "A 50% Power Reduction Scheme for CMOS Relaxation Oscillator," IEEE, 1999, pp. 154-157; 4 pages.
Specks et al., "A Mixed Digital-Analog 16B Microcontroller with 0.5MB Flash Memory, On-Chip Power Supply, Physical Nework Interface, and 40V I/O for Automotive Single-Chip Mechatronics," IEEE, Feb. 9, 2000; 1 page.
Stallman et al.; "Debugging with the GNU Source-Level Debugger"; Jan. 1994; retrieved on May 2, 2005 from http://www.cs.utah.edu; 4 pages.
Stan Augarten; "The Chip Collection—Introduction—Smithsonian Institute"; "State of the Art"; "The First 256-Bit Static RAM"; retrieved on Nov. 14, 2005 from http://smithsonianchips.si.edu/augarten/p24.htm; 2 pages.
Stephen Walters, "Computer-Aided Prototyping for ASIC-Based Systems," 1991, IEEE Design & Test of Computers, vol. 8, Issue 2, pp. 4-10; 8 pages.
U.S. Appl. No. 60/243,708: "Advanced Programmable Microcontroller Device," Snyder et al., filed Oct. 26, 2000; 277 pages.
Tran et al., "Fine Pitch and Wirebonding and Reliability of Aluminum Capped Copper Bond Pads," May 2000, IEEE Electronic Components and Technology Conference, pp. 1674-1680; 7 pages.
USPTO Advisory Action for U.S. Appl. No. 12/004,833 dated Aug. 9, 2011; 3 pages.
USPTO Advisory Action for U.S. Appl. No. 12/058,586 dated Jan. 31, 2012; 3 pages.
USPTO Advisory Action for U.S. Appl. No. 12/058,586 dated Oct. 9, 2013; 2 pages.
USPTO Final Rejection for U.S. Appl. No. 12/004,833 dated May 25, 2011; 11 pages.
USPTO Final Rejection for U.S. Appl. No. 12/058,586 dated Jul. 19, 2013; 19 pages.
USPTO Final Rejection for U.S. Appl. No. 12/058,586 dated Nov. 9, 2011; 14 pages.
USPTO Non-Final Rejection for U.S. Appl. No. 12/004,833 dated Nov. 9, 2011; 11 pages.
USPTO Non-Final Rejection for U.S. Appl. No. 12/004,833 dated Dec. 21, 2010; 8 pages.
USPTO Non-Final Rejection for U.S. Appl. No. 12/058,569 dated Aug. 2, 2010; 9 pages.
USPTO Non-Final Rejection for U.S. Appl. No. 12/058,586 dated Jan. 28, 2013; 16 pages.
USPTO Non-Final Rejection for U.S. Appl. No. 12/058,586 dated May 24, 2011; 13 pages.
USPTO Non-Final Rejection for U.S. Appl. No. 12/058,586 dated Aug. 14, 2012; 13 pages.
USPTO Non-Final Rejection for U.S. Appl. No. 13/586,648 dated Jul. 18, 2013; 6 pages.
USPTO Notice of Allowance for U.S. Appl. No. 12/004,833 dated Mar. 1, 2012; 7 pages.
USPTO Notice of Allowance for U.S. Appl. No. 12/004,833 dated May 24, 2012; 5 pages.
USPTO Notice of Allowance for U.S. Appl. No. 12/004,833 dated Jun. 21, 2012; 5 pages.
USPTO Notice of Allowance for U.S. Appl. No. 12/004,833 dated Jul. 19, 2012; 5 pages.
USPTO Notice of Allowance for U.S. Appl. No. 12/058,569 dated Apr. 11, 2011; 7 pages.
USPTO Notice of Allowance for U.S. Appl. No. 12/058,569 dated Aug. 3, 2011; 7 pages.
USPTO Notice of Allowance for U.S. Appl. No. 12/058,569 dated Dec. 13, 2010; 6 pages.
USPTO Notice of Allowance for U.S. Appl. No. 12/058,586 dated Jan. 28, 2014; 7 pages.
USPTO Notice of Allowance for U.S. Appl. No. 12/058,586 dated Mar. 14, 2014; 7 pages.
USPTO Notice of Allowance for U.S. Appl. No. 12/058,586 dated Dec. 16, 2013; 10 pages.
USPTO Notice of Allowance for U.S. Appl. No. 13/171,061 dated Jan. 28, 2013; 7 pages.
USPTO Notice of Allowance for U.S. Appl. No. 13/171,061 dated Mar. 8, 2013; 7 pages.
USPTO Notice of Allowance for U.S. Appl. No. 13/171,061 dated Jun. 10, 2013 ; 8 pages.
USPTO Notice of Allowance for U.S. Appl. No. 13/171,061 dated Nov. 29, 2012; 7 pages.
USPTO Notice of Allowance for U.S. Appl. No. 13/586,648 dated Sep. 16, 2013; 6 pages.
USPTO Requirement for Restriction for U.S. Appl. No. 12/004,833 dated Sep. 22, 2010; 6 pages.
Van Ess, David; "Simulating a 555 Timer with PSoC," Cypress Semiconductor Corporation, Application Note AN2286, May 19, 2005; 10 pages.
Varma et al., "A Structured Test Re-Use Methodology for Core-Based System Chips," IEEE, 1998; 9 pages.
Vixel, "InSpeed SOC 320 Embedded Storage Switch," 2003, Vixel, pp. 1-5; 5 pages.
Wang, et al. "Synthesizing Operating System Based Device Drivers in Embedded Systems," Oct. 1-3, 2003; ACM, pp. 37-44; 8 pages.
Wikipedia—Main Page, retrieved on Mar. 8, 2006 from http://en.wikipedia.org/wiki/Main_Page and http://en.wikipedia.org/wiki/Wikipedia:Introduction; 5 pages.
Wikipedia—Processor register, retrieved on Mar. 7, 2006 from http://en.wikipedia.org/wiki/Processor_register; 4 pages.
Wikipedia "XML" retrieved on Jan. 29, 2007 from http://en.wikipedia.org/wiki/XML; 16 pages.
Wikipedia.org; "Von Neumann architecture"; retrieved from http://en.wikipedia.org/wiki/Von_Neumann_architecture on Jan. 22, 2007; 4 pages.
Xerox, "Mesa Debugger Documentation," Apr. 1979; Xerox Systems Development Department; Version 5.0, pp. 1-30; 33 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
Yoo et al., "Fast Hardware-Software Coverification by Optimistic Execution of Real Processor, Proceedings of Design, Automation and Test in Europe Conference and Exhibition," Mar. 2000, pp. 663-668; 6 pages.
York et al., "On-chip Support Needed for SOC Debug," Electronic Engineering Times, Jun. 1999, pp. 104, 110; 2 pages.
USPTO Non-Final Rejection for U.S. Appl. No. 13/171,061 dated Oct. 2, 2012; 5 pages.
USPTO Notice of Allowance for U.S. Appl. No. 12/058,586 dated May 2, 2014; 7 pages.
Durham et al., "High-Linearity Conitnuous-Time Filter in 5-V VLSI CMOS," IEEE, 1992; 8 pages.
Durham et al., "Integrated Continuous-Time Balanced Filters for 16-bit DSP Interfaces," IEEE, 1993; 6 pages.

(56) References Cited

OTHER PUBLICATIONS

Duvvuru et al., "Evaluation of a Branch Target Address Cache," 1995, IEEE, pp. 173-180; 8 pages.
Ebeling et al., "Validating VLSI Circuit Layout by Wirelist Comparison," Sep. 1983, In the Proceedings of the IEEE International Conference on Computer Aided Design (ICCAD-83), pp. 172-173; 2 pages.
Ebling, "Gemini II: A Second Generation Layout Validation Program;" 1988; in proceedings of the IEEE International Conference on Computer Aided Design (ICCAD-88); 4 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
Electronic Tools Company; E-Studio User Manuel; 2000; retrieved from http://web.archive.org for site http://e-tools.com on Mar. 23, 2005; 77 pages.
Frank Goodenough, "Analog Counterparts of FPGAS Ease System Design," Electronic Design, Penton Publishing, Cleveland, OH, Oct. 14, 1994, vol. 42, No. 21, pp. 63-66, 68; 10 pages.
Fred Eady, "PSoC 101," Circuit Cellar, Aug. 2004, accessed Sep. 13, 2005, http://www.circuitcellar.com/library/print/0804/eady16912.htm; 4 pages.
Ganapathy et al., "Hardware Emulation for Functional Verification of K5", Jun. 1996, 33rd Design Automation Conference Proceedings, Jun. 3-7, 1996, pp. 315-318; 4 pages.
Ghosh et al., "A Low Overhead Design for Testability and Test Generation Technique for Core-based Systems," IEEE, 1997; 10 pages.
Haberl et al., "Self Testable Boards with Standard IEEE 1149.5 Module Test and Maintenance (MTM) Bus Interface," IEEE, 1994; 6 pages.
Hamblen, "Rapid Prototyping Using Field-Programmable Logic Devices" Jun. 2000, IEEE; 9 pages.
Harbaum et al. "Design of a Flexible Coprocessor Unit" Proceedings of the Euromicro Conference, XX XX, Sep. 1999, pp. 335-342; 10 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.
Hintz et al., "Microcontrollers," 1992, McGraw-Hill, pp. 29-37; 11 pages.
Hong et al., "An FPGA-Based Hardware Emulator for Fast Fault Emulation," IEEE, 1997, pp. 345-348; 4 pages.
Hong et al., "Hierarchial System Test by an IEEE 1149.5 MTM-Bus Slave-Module Interface Core," IEEE, 2000; 14 pages.
Hsieh et al., "Modeling Micro-Controller Peripherals for High-Level Co-Simulation and Synthesis," IEEE, 1997, pp. 127-130; 4 pages.
Huang et al., "Iceberg: An Embedded In-Circuit Emulator Synthesizer for Microcontrollers", Proceedings of the 36th Design Automation Conference, Jun. 1999, pp. 580-585; 6 pages.
Hwang et al., "Integrated circuit for automatically varying resistance in computer system, has pair of transistors connected in parallel with respective resistors such that resistors are bypassed when corresponding transistors are enabled," Derwent information LTD; 2002; 2 pages.
Ito et al., "A Comparison of Microcontrollers Targeted to FPGA-Based Embedded Applications", Sep. 2000, Proceedings of 13th Symposium on Integrated Circuits and Systems Design, Sep. 18-24, 2000, pp. 397-402; 6 pages.
John Mangino, "Using DMA with High Performance Peripherals to Maximize System Performance," 2007, Texas Instruments, pp. 1-23; 23 pages.
Jonathan B. Rosenburg, "How Debuggers Work" John Wiley & Sons, Inc. 1996; 259 pages.
Julio Faura et al.; "A Novel Mixed Signal Programmable Device With On-Chip Microprocessor", 1997, IEEE 1997 Custom Integrated Circuits Conference, pp. 103-106; 4 pages.
Jung et al., "A Register File with Transposed Access Mode," 2000, IEEE; 2 pages.
Khan et al.; "FPGA Architectures for Asic Hardware Emulators"; IEEE 1993, pp. 336-340; 5 pages.
Kory Hopkins, "Definition;" Jan. 16, 1997; <http://www.cs.sfu.ca/cs/people/GradStudent.html>; 1 page.
Larsson, "A 2-1600-MHz CMOS Clock Recovery PLL with Low-Vdd Capability," IEEE Journal of Solid-State Circuits, vol. 34, No. 12, Dec. 1999; 10 pages.
Lee, Mark; "EMC Design Considerations for PSoC CapSense Applications," Cypress Semiconductor Corporation, Application Note AN2318; Sep. 16, 2005; 6 pages.
Lutovac et al. "Symbolic Computation of Digital Filter Transfer Function Using MATLAB," Proceedings of 23rd International Conference on Microelectronics, vol. 2 NIS, Yugoslavia, May 2002, pp. 651-654; 4 pages.
M. Moods Mano, "Computer System Architecture," 1982, Prentice-Hall, 2nd Edition, pp. 261-264 and 435-440; 14 pages.
Maneatis, "Low-Jitter Process-Independent DLL and PLL Based on Self-Biased Techniques," IEEE Journal of Solid-State Circuits, vol. 31, No. 11, Nov. 1996, pp. 1723-1732; 10 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, vol. 45 No. 3, Feb. 3, 2000, pp. 129-138; 7 pages.
Microsoft Computer Dictionary "ActiveX" 2002; Microsoft Press; 5th Edition; 3 pages.
Microsoft Press Computer User's Dictionary; 1998; 3 pages (including p. 18).
Monte Mar et al., "An architecture for a configurable Mixed-signal device", 2003, IEEE Journal of Solid-State Circuits, vol. 3, pp. 565-568; 4 pages.
Morrison, Gale, "IBM Eyes Merchant Packaging Services," Jul. 13, 2998, Electronic News, available at http://www.findarticles.com; 4 pages.
Nam et al., "Fast Development of Source-Level Debugging System Using Hardware Emulation," IEEE, 2000, pp. 400-404; 4 pages.
Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Oh et al., "Emulator Environment Based on an FPGA Prototyping Board," IEEE, Jun. 21-23, 2000, pp. 72-77; 6 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Papachristou et al., "Microprocessor Based Testing for Core-Based System on a Chip," IEEE, 1999; 6 pages.
Pasternak, "In-Circuit-Emulation in ASIC Architecture Core Designs," IEEE, 1989, pp. P6-4.1-P6-4.4; 4 pages.
Robert A. Blauschild, "WP 3.5: An Integrated Time Reference," ISSCC94/Session 3, Analog Techniques/Paper WP 3.5, Feb. 1994, pp. 56-58; 4 pages.
Robinson, Gordon D., "Why 1149.1 (JTAG) Really Works", May 1994, Conference Proceedings Electro/94 International, May 10-12, 1994, Combined Volumes, pp. 749-754; 6 pages.
Ryan Seguine et al., "Layout Guidelines for PSoC CapSense", Cypress Application Note AN2292, Revision B, Oct. 31, 2005, pp. 1-15.
Sedra, Adel S. et al., "Microelectronic Circuits," 3rd Edition, Oxford University Press, pp. xiii-xx and 861-883, 1991; 20 pages.
Seguine, Ryan; "Layout Guidelines for PSoC CapSense," Cypress Semiconductor Corporation, Application Note AN2292; Jul. 22, 2005; 13 pages.
"An Analog PPL-Based Clock and Data Recovery Circuit with High Input Jitter Tolerance;" Sun, Reprinted from IEEE Journal of Solid-State Circuits, 1989; 4 pages.
"Electronic Circuit Protector-Circuit Breaker;" IBM Technical Disclosure Bulletin; vol. 36, Issue 8, Aug. 1, 1993; 1 page.
"In-Curcuit Emulators—descriptions of the major ICEs around," retrieved on Nov. 14, 2005 from http://www.algonet.se/~staffann/developer/emulator.htm; 6 pages.

(56) References Cited

OTHER PUBLICATIONS

"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.

"New Object Domain R3 Beta Now Available (Build 134)!" Mar. 13, 2001; http://web.archive.org/web/200100331202605/www.objectdomain.com/domain30/index.html; 2 pages.

"OMG XML Metadata Interchange (XMI) Specifications" 2000; 17 pages.

"POD—Piece of Data, Plain Old Documentation, Plain Old Dos . . . "; retrieved on Nov. 14, 2005 from http://www.auditmypc.com/acronym/POD.asp; 2 pages.

"PSoC Designer: Integrated Development Environment User Guide"; Jul. 17, 2001; Cypress MicroSystems; Revision 1.11; all pages.

"PSoC designer: Integrated development environment, getting started 25-minute tutorial, version 1.0," Cypress Microsystems., Cypress Microsystems, Inc. CMS10006A, Jul. 3, 2001; 25 pages.

"PSoC technology complete changes 8-bit MCU system design", Cypress Microsystems, Inc. retrieved from <http>://www.archive.org/web/20010219005250/http://cypressmicro.com- /t . . . >, Feb. 19, 2001; 21 pages.

"The Gemini Netlist Comparison Project;" <http://www.cs.washington.edu/research/projects/lis/www/gemini/gemini.html> larry@cs.washington.edu; Mar. 19, 2002; 2 pages.

"VHDL Samples" retrieved on Jan. 29, 2007 from http://www.csee.umbc.edu/help/VHDL/samples/samples.shtml; 10 pages.

"Webster's Third New International Dictionary," 1996, G. & C. Merriam Company; 3 pages (including pp. 1328-1329).

A.F. Harvey, "DMA Fundamentals on Various PC Platforms," 2001, 2004, National Instruments Corporation, pp. 1-19; 19 pages.

Adham et al., "Preliminary Outline of the IEEE P1500 Scalable Architecture for Testing Embedded Cores," 1999, IEEE; 6 pages.

Andrew S. Tanenbaum with contributions from James R. Goodman, "Structured Computer Organization," 1999, Prentice Hall, Fourth Edition; 32 pages.

Andrews, "Roadmap for Extending IEEE 1149.1 for Hierarchical Control of Locally-Stored, Standardized command Set, Test Programs," IEEE, 1994; 7 pages.

Anonymous, "F/Port:Fast Parallel Port for the PC" Installation Manual Release 7.1, circa 1997, available for download from http://www.fapo.com/fport.htm; 25 pages.

Anonymous, "JEEN JTAG Embedded Ice Ethernet Interface," Aug. 1999, Embedded Performance, Inc.; 3 pages.

Anonymous, "Lotus Notes FAQ—How do you generate unique document numbers?" Sep. 19, 1999; retrieved from www.keysolutions.com on Jul. 9, 2008; 1 page.

Anonymous, "Warp Nine Engineering—The IEEE 1284 Experts-F/Port Product Sheet," undated web page found at http://www.fapo.com/fport.htm; printed on Apr. 12, 2005; 2 pages.

Anonymous; "Using Debug"; 1999; Prentice-Hall Publishing; 20 pages.

U.S. Appl. No. 12/058,586: "System and Method for Monitoring a Target Device," Kenneth Ogami et al., filed on Mar. 28, 2008; 56 pages.

Ashok Bindra, "Programmable SoC Delivers a New Level of System Flexibility"; Electronic Design; Nov. 6, 2000; 11 pages.

Atmel Corporation: AT9OSC Summary: "Secure Microcontrollers for Smart Cards," Oct. 1999; 7 pages.

Azim et al., "A Custom DSP Chip to Implement a Robot Motion Controller Proceedings of the IEEE Custom Integrated Circuits Conference," May 1988, pp. 8.7.1-8.7.5; 6 pages.

Bakker et al., "Micropower CMOS Temperature Sensor with Digital Output," IEEE Journal of Solid-State Circuits, Jul. 1996; 3 pages.

Balough et al., "White Paper: Comparing IP Integration Approaches for FPGA Implementation," Feb. 2007, Version 1.1, Altera, pp. 1-7; 7 pages.

Bauer et al.; "A Reconfigurable Logic Machine for Fast Event-Driven Simulation"; Jun. 1998; Design Automation Conference Proceedings; 8 pages.

Burogs et al., "Power Converter Analysis and Design using Matlab: A Transfer Function Approach," Proceedings of IEEE International Symposium on Industrial Electronics 1998, vol. 2, pp. 552-557; 6 pages.

Bursky, "FPGA Combines Multiple Interfaces and Logic," Electronic Design, vol. 48 No. 20, Oct. 2, 2000, pp. 74-78; 5 pages.

Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.

Chapweske, Adam; "The PS/2 Mouse Interface," PS/2 Mouse Interfacing, 2001, retrieved on May 18, 2006; 10 pages.

Charles Melear, "Using Background Modes for Testing, Debugging and Emulation of Microcontrollers," IEEE, 1997, pp. 90-97; 8 pages.

Charles, Jr. et al., "Wirebonding: Reinventing the Process for MCMs," Apr. 1998, IEEE 7th International Conference on Multichip Modules and High Density Packaging, pp. 300-302; 3 pages.

Ching et al., "An In-Curcuit-Emulator for TMS320C25," IEEE, 1994, pp. 51-56; 6 pages.

Cover Pages Technology Reports; XML and Electronic Design Automation (EDA); Aug. 2000; retrieved from http://xml.coverpages.org on Mar. 23, 2005; 5 pages.

Cypress MicroSystem, Inc. "Cypress Customer Forums" retrieved from <http://www.cypress.com/forums/messageview>; Nov. 30, 2004; 1 page.

Cypress MicroSystem, Inc. "PsoC Designer: Integrated Development Environment User Guide"; Rev. 1.18; Sep. 8, 2003; 193 pages.

Cypress MicroSystems, Inc. "Cypress MicroSystems Unveils Programmable System-On-A-Chip for Embedded Internet, Communications, and Consumer Systems" Nov. 13, 2000; 3 pages.

Cypress Semiconductor Corporation, "CY8C21x34 Data Sheet," CSR User Module, CSR V.1.0; Oct. 6, 2005; 36 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation, "PSoC CY8C20x34 Technical Reference Manual (TRM)," PSoC CY8C20x34 TRM, Version 1.0, 2006; 218 pages.

Cypress Semiconductor Corporation, "PSoC Mixed-Signal Controllers," Production Description; <http://www.cypress.com/portal/server>; retrieved on Sep. 27, 2005; 2 pages.

Cypress Semiconductor Corporation, "Release Notes srn017," Jan. 24, 2007; 3 pages.

Dahl et al., "Emulation of the Sparcle Microprocessor with the MIT Virtual Wires Emulation System," 1994, IEEE, pp. 14-22; 9 pages.

Daniel B. Sedory, "A Guide to DEBUG," 2004, retrieved on May 20, 2005 from http://www.geocites.com/thestarman3/asm/debug/debug2.htm, pp. 1-11; 7 pages.

Dirk Killat, "A One-Chip Solution for Electronic Ballasts in Fluorescent Lamps," Power Electronics, http://powerelectronics.com/mag/power_onechip_solution_electronic/, dated Mar. 1, 2004, accessed Sep. 13, 2005; 4 pages.

Durham et al., "Circuit Architectures for High Linearity Monolithic Continuous-Time Filtering," IEEE, 1992; 7 pages.

U.S. Appl. No. 12/058,569: "Configuration of Programmable IC Design Elements," Best et al., filed Mar. 28, 2008; 19 pages.

USPTO Final Rejection for U.S. Appl. No. 10/256,829 dated Jan. 27, 2006; 24 pages.

USPTO Final Rejection for U.S. Appl. No. 10/256,829 dated Jun. 1, 2007; 16 pages.

USPTO Final Rejection for U.S. Appl. No. 10/256,829 dated Jun. 23, 2009; 8 pages.

USPTO Final Rejection for U.S. Appl. No. 10/327,207 dated Mar. 2, 2006; 13 pages.

(56) References Cited

OTHER PUBLICATIONS

USPTO Final Rejection for U.S. Appl. No. 13/178,504 dated Dec. 13, 2013; 9 pages.
USPTO Miscellaneous Action for U.S. Appl. No. 10/327,207 dated May 13, 2003; 1 page.
USPTO Non Final Rejection for U.S. Appl. No. 13/178,504 dated Apr. 18, 2014; 8 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Non-Final Rejection for U.S. Appl. No. 10/256,829 dated Jan. 7, 2009; 7 pages.
USPTO Non-Final Rejection for U.S. Appl. No. 10/256,829 dated May 3, 2006; 16 pages.
USPTO Non-Final Rejection for U.S. Appl. No. 10/256,829 dated Jun. 26, 2008; 11 pages.
USPTO Non-Final Rejection for U.S. Appl. No. 10/256,829 dated Jul. 12, 2012; 7 pages.
USPTO Non-Final Rejection for U.S. Appl. No. 10/256,829 dated Jul. 28, 2005; 14 pages.
USPTO Non-Final Rejection for U.S. Appl. No. 10/256,829 dated Oct. 26, 2009; 8 pages.
USPTO Non-Final Rejection for U.S. Appl. No. 10/256,829 dated Nov. 2, 2006; 13 pages.
USPTO Non-Final Rejection for U.S. Appl. No. 10/327,207 dated Jul. 21, 2006; 12 pages.
USPTO Non-Final Rejection for U.S. Appl. No. 10/327,207 dated Sep. 20, 2005; 11 pages.
USPTO Non-Final Rejection for U.S. Appl. No. 13/178,504 dated Mar. 29, 2013; 8 pages.
USPTO Non-Final Rejection for U.S. Appl. No. 13/178,504 dated Jul. 16, 2013; 8 pages.
USPTO Non-Final Rejection for U.S. Appl. No. 13/182,431 dated Jul. 3, 2012; 7 pages.
USPTO Notice of Allowance for U.S. Appl. No. 09/989,817 dated May 9, 2005; 6 pages.
USPTO Notice of Allowance for U.S. Appl. No. 10/256,829 dated Mar. 12, 2012; 7 pages.
USPTO Notice of Allowance for U.S. Appl. No. 10/256,829 dated May 10, 2010; 4 pages.
USPTO Notice of Allowance for U.S. Appl. No. 10/256,829 dated Jun. 5, 2013; 8 pages.
USPTO Notice of Allowance for U.S. Appl. No. 10/256,829 dated Sep. 12, 2012; 4 page.
USPTO Notice of Allowance for U.S. Appl. No. 10/256,829 dated Sep. 29, 2011; 7 pages.
USPTO Notice of Allowance for U.S. Appl. No. 10/256,829 dated Oct. 29, 2007; 6 pages.
USPTO Notice of Allowance for U.S. Appl. No. 10/256,829 dated Nov. 1, 2012; 2 pages.
USPTO Notice of Allowance for U.S. Appl. No. 10/265,829 dated Nov. 27, 2012; 5 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Notice of Allowance for U.S. Appl. No. 12/057,149 dated Mar. 17, 2011; 8 pages.
USPTO Notice of Allowance for U.S. Appl. No. 12/057,149 dated Jul. 8, 2011; 8 pages.
USPTO Notice of Allowance for U.S. Appl. No. 12/057,149 dated Nov. 30, 2010; 7 pages.
USPTO Notice of Allowance for U.S. Appl. No. 13/178,504 dated Aug. 29, 2014; 5 pages.
USPTO Notice of Allowance for U.S. Appl. No. 13/182,431 dated Jun. 19, 2013; 8 pages.
USPTO Notice of Allowance for U.S. Appl. No. 13/182,431 dated Oct. 12, 2012; 7 pages.
USPTO Notice of Allowance for U.S. Appl. No. 13/182,431 dated Nov. 28, 2012; 8 pages.

* cited by examiner

400

410
Receiving a change in design element value in real time, wherein the design element values are associated with an operating target device.

420
Analyzing the changes in the design element value.

430
Updating express interface information in accordance with results of the analyzing.

FIG 4A

SYSTEM AND METHOD FOR CONTROLLING A TARGET DEVICE

RELATED APPLICATIONS

This Application claims the benefit and priority of Provisional Application No. 60/926,096 entitled "Novel Features for a Design Tool" filed on Apr. 25, 2007, which is incorporated herein by this reference. This Application is also a continuation in part of U.S. patent application Ser. No. 12/004,833 entitled "Systems and Methods for Dynamically Reconfiguring a Programmable System on a Chip" filed Dec. 21, 2007, which is incorporated herein by this reference.

This application is also related to U.S. Pat. No. 6,971,004, application Ser. No. 9/989,817 filed Nov. 19, 2001 entitled "System and Method of Dynamically Reconfiguring a Programmable System on a Chip" and patent application Ser. No. 10/256,829, filed Sep. 27, 2002 entitled "Graphical User Interface for Dynamically Reconfiguring a Programmable Device" which are hereby incorporated by this reference.

FIELD OF THE INVENTION

Embodiments of the present invention generally relate to the field of integrated circuit chips. More specifically, embodiments of the present invention pertain to a system and method for dynamically reconfiguring a programmable system on a chip.

BACKGROUND

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Electronic systems designed to provide these benefits often include integrated circuits on a single substrate that provide a variety advantages over discrete component circuits. However, traditional design and manufacturing approaches for integrated circuits are often very complex and consume significant resources.

Traditionally electronic components were custom designed for a relatively narrow range of applications with a fixed combination of required peripheral functionalities. Developing custom component designs with particular fixed peripherals is time and resource intensive. Even if a component may suffice for more than one application, determining which one of the different available particular microcontroller designs is best suited for a particular application is challenging. In addition, the unique aspects of the intended application often make it difficult to find an optimum component, usually necessitating a compromise between the convenience of using an existing component design and less than optimum performance. For a number of conventional approaches, when a suitable component is found, subsequent changes to the application and new requirements placed on the application can lead to the need for a totally different traditional component.

Traditional components that attempt to provide some flexibility can be problematic because they tend to require a sophisticated amount of design expertise and the obstacles of long development times and high costs still remain. To the extent some flexibility may be provided by the inclusion of gate arrays or other logic devices, the traditional approaches remain expensive and require a sophisticated level of design expertise. In addition traditional integrated circuit configurations and functionality are typically set during initial manufacture and are not readily adaptable to changing conditions in the field.

In addition to complexity and sophisticated design procedures, real time monitoring and/or control of operating components can be challenging. Traditional monitoring and/or control of integrated circuits typically involves complex interactions with complicated command structures and syntaxes that are not readily comprehendible or user friendly. Recognizing alterations in convoluted expressions of operating states, evaluating implications of the alterations and/or reacting to the evaluation appropriately using elaborate command and data input mechanisms with sufficient speed to be useful in real time is particularly difficult.

SUMMARY

Target device monitoring systems and methods are presented. In one embodiment, a host emulation target device control method includes receiving high level express interface direction to change a design element value. The design element values are associated with an operating target device. Design element values corresponding to the direction are created. The design element values are also forwarded to the operating target device in real time.

DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 4A is a flow chart of an exemplary target device monitoring update method in accordance with one embodiment of the present invention.

DETAILED DESCRIPTION OF THE INVENTION

Figure 1A:
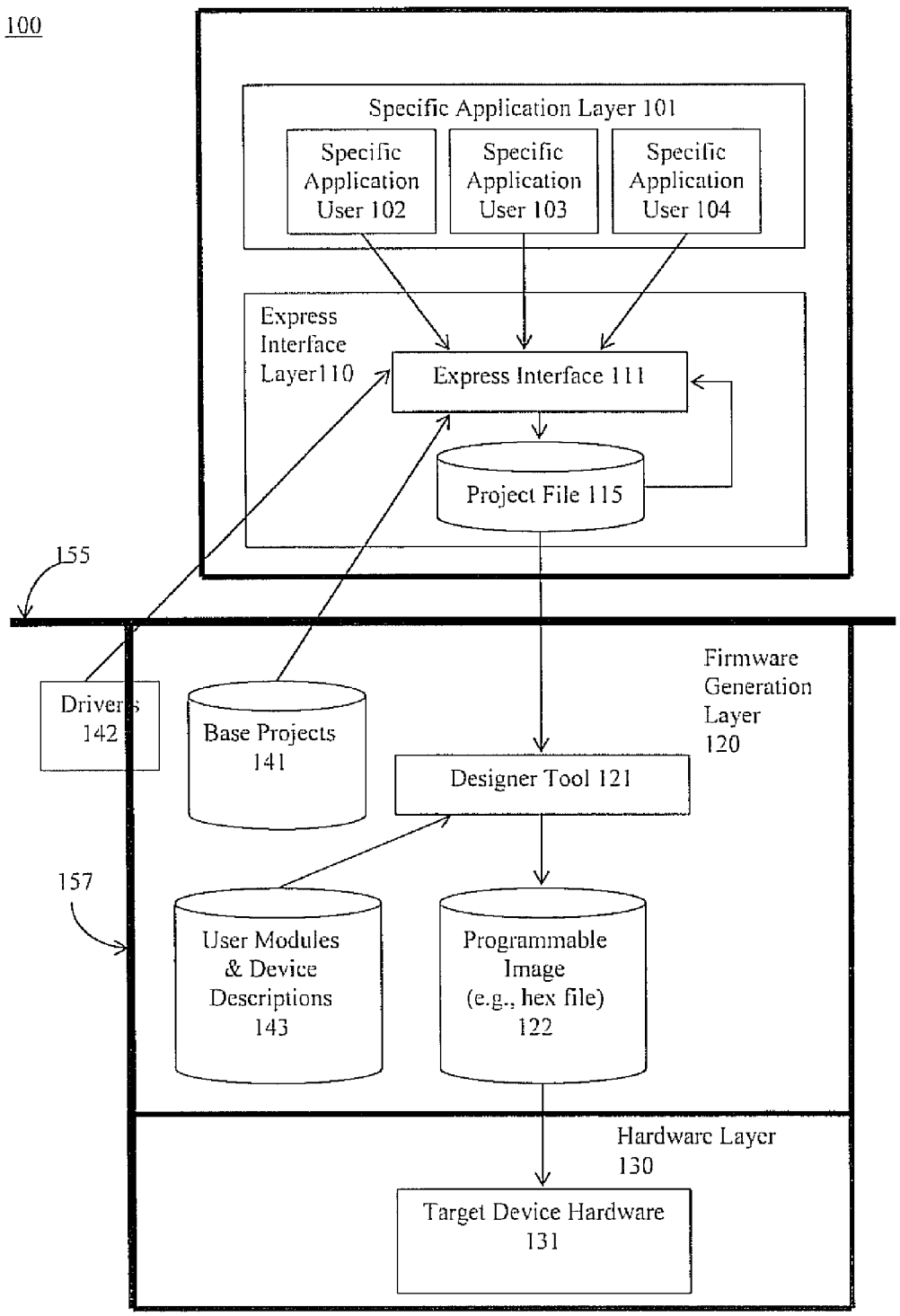
FIG. 1A is a block diagram of an exemplary express design system architecture in accordance with one embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

Systems and methods for monitoring and controlling an operating reconfigurable target device in real time are presented. In one embodiment of the present invention, a user friendly graphical user interface is utilized to facilitate symbolic indication of corresponding changes in a design element value. In one exemplary implementation of the present invention, a plurality of configuration images defining different configurations and functionalities of a target device are stored in a memory included in the target device. The image information including various element values can be monitored and/or controlled in real time during target device operation. The configuration image data can be generated, monitored, updated and loaded on the target device in various manners including by an express interface and electronic device design tool. In one embodiment, the express interface and electronic device design tool comprise progressively higher level representations of the target device design element values and are utilized to generate project files for directing automated utilization by a lower level device designer that defines module personalization and parameterization, generates source code (e.g., application program interface code), and facilitates debugging. The exemplary embodiments described herein (e.g., a microcontroller) are not meant to limit the application of the present invention to any specific integrated circuit device or type (e.g., a microcontroller) and embodiments of the present invention may be implemented in a variety of integrated circuits.

FIG. 1A is a block diagram of an exemplary express design system architecture 100 in accordance with one embodiment of the present invention. Express design system architecture 100 includes specific application layer 101, express interface layer 110, firmware generation layer 120, and hardware layer 130. Specific application layer 101 includes specific application user 102, specific application user 103 and specific application user 104. Express interface layer 110 includes express interface 111, and project file 115. Firmware generation layer includes designer tool 121, programmable image 122, drivers 142, base projects 141 and user modules and device descriptions 143. Hardware layer 131 includes target device hardware 131.

The components of express design system architecture 100 cooperatively operate to facilitate convenient configuration of target device hardware 131. The architecture can cover three domains, a simplified user domain above line 155 and below line 155 an expert user domain to the right of line 157 and driver author domain to the left of line 157. In the simplified user domain a specific application user 102, 103 or 104 can input directions to express interface 111. The specific application users can be a variety of different types of users (e.g., an ICO maker, battery charger manufacturer, a power meter manufacturer, etc.) with minimal amount of knowledge and/or experience in the low level design intricacies associated with the target device hardware 131. Express interface 111 provides a user friendly convenient graphically user interface (GUI) which conveys information between a user and the target device hardware 131 while performing translation between relatively simple symbolic representations of information presented to the user and corresponding complex information utilized by the target hardware device 131.

In one embodiment, the express design interface is a high-level embedded system design tool that automatically generates a complete application ready to program into an embedded system or target device. A user can create a complete design for a target device and monitor and/or control the design element values in real time while the target device is operating. In one exemplary implementation the user can perform the designing, monitoring and/or controlling without manually entering traditional programming code (e.g., assembly language code, "C" programming code, etc.) or reading a data sheet.

In one embodiment, the express design interface allows users to create a circuit design by dragging and dropping high level "widget" icons representing design elements within a graphical user interface (GUI) window. The widgets are icons that can be utilized to represent the functions and values associated with a design element. The design elements can represent a variety of "widgets" including input devices, environment measuring devices, transfer functions, output devices, etc. For example, the design elements can be buttons, sliders, LED devices, temperature sensors, alarms, fans, transfer functions, logic for generating an alarm, etc. The widget icons and associated information boxes can be presented in a variety of manners (e.g., textual, graphical, etc.) and present various information (e.g., slider position, on/off status, level, brightness, etc). User inputs associated with the high level design elements are automatically translated and utilized to create lower level user module information which is fed into a design tool for automated generation of information implemented in a target device.

In one embodiment, the express user interface is implemented on a host computer that is coupled to a target device (e.g., a microcontroller) via a communication interface. The onscreen widgets are mapped to registers of the target device. For example, the on screen widgets are mapped to registers that hold values representing the current state of the design elements during the execution of an application running on the microcontroller of the target device. Some of the communication registers (e.g., RAM, other memory registers, etc.) are read only areas and some are read/write areas.

In one embodiment, the updating of the widgets of a design is performed in real time during run-time as an application is being executed on the microcontroller so that the designer can directly observe the real time states of the communication registers. In one exemplary implementation, software periodically monitors the values of the communication registers within the microcontroller and these values are mapped back to the associated widgets. The graphical representation of the widget is then updated live based on the live update data from the target hardware. Therefore, inputs, outputs, values of transfer functions, etc., can be directly observed during the operation of an application on the microcontroller. This is very helpful for debugging purposes, etc. For example, button presses, temperatures, output values, transfer function values, and logic can be observed in real-time on the host computer screen via the widgets.

A microcontroller of the target device can be emulated on the host computer during the monitoring of an application executing on the target hardware. Instructions can be input to the target hardware from the host computer. The instructions can be directed to a variety of activities including changing program flow, mode of operation, etc. that would have originated from a host computer system connected the target hardware. In one embodiment, the interface is emulated using the features of a board monitor.

In one embodiment a drop down menu within the express interface window allows a user to change the mode of operation of the application running on the target hardware. The drop down window or menu can allow the user to input a command that alters read/write area of the communication registers (RAM) on the target device. The command can then cause some reaction within the target hardware which is observed by the real-time update monitoring of the widgets on the host computer screen. In one embodiment, a host emulation does not permit the read only RAM registers to be updated and ROM portion of the microcontroller either.

The information input to the GUI is translated by the express interface 111. In one embodiment, express interface retrieves driver information 142 and base project information 141 corresponding to received input information and generates project files 115. Project file 115 includes instructions and data for directing automated utilization by a lower level device designer that defines module personalization and parameterization, generates source code (e.g., application program interface code), and facilitates debugging.

Figure 1B:
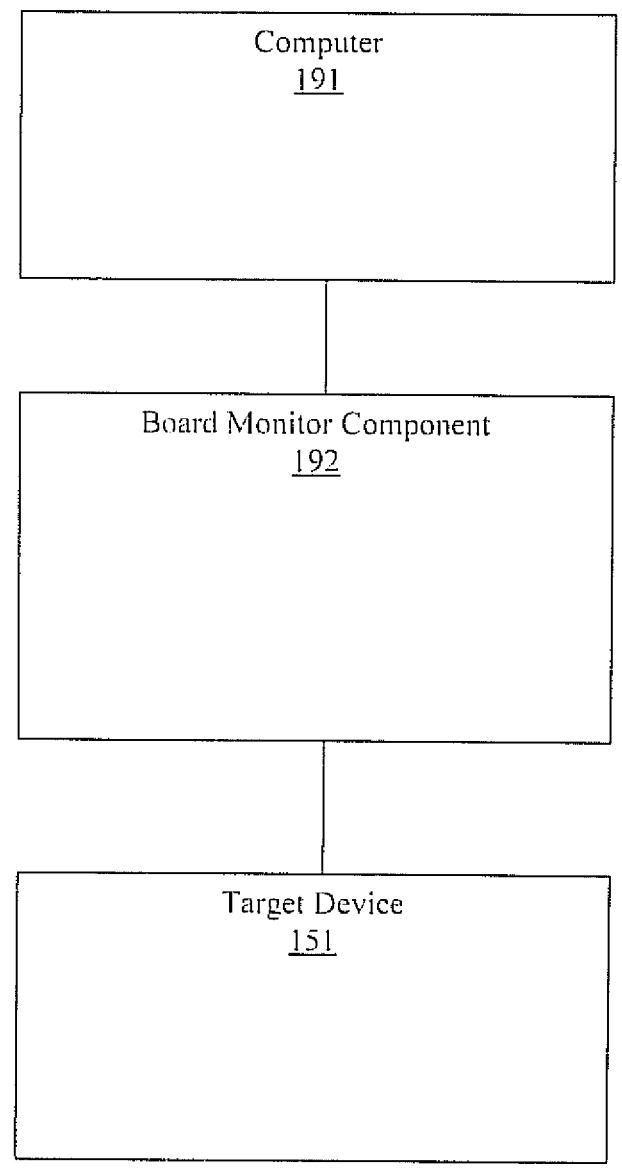
FIG. 1B is a bock diagram of an exemplary express design system in accordance with one embodiment of the present invention.

FIG. 1B is a bock diagram of an exemplary express design system 190 in accordance with one embodiment of the present invention. Express design system 190 includes host computer system 191, board monitor component 192 and target device 151. Host computer system 191 is communicatively coupled to board monitor component 192 which in turn is coupled to target device 151.

The components of exemplary design system 190 cooperatively operate to design and monitor target device 151. Target device 151 can implement a variety of configurations and functionalities. Host computer system 191 creates a design definition for implementing the variety of configuration and functionalities and monitoring operations of the target device in real time. The board monitor component 192 interfaces between the host computer system and the target device in real time while the target device is operating. In one embodiment, the board monitor component includes a USB interface for interfacing with the host computer and an I2C interface for interfacing with the target device. In one exemplary implementation, the board monitor is working on a hex file as the hex file is executing on the target device. The hex file can be static. The host computer comprises a graphical user interface presentation in a user friendly intuitive configuration that automatically updates the presentation in accordance with design element values received in real time.

The host computer system can also emulate a microcontroller of the target device in real time while the target device is operating. When a host computer is emulating a microcontroller of the target device a user can change the values in real time. The monitoring function also permits the user to receive information and analyze the impacts of the changes in real time. The inputting includes symbolically indicated inputs.

Figure 6:
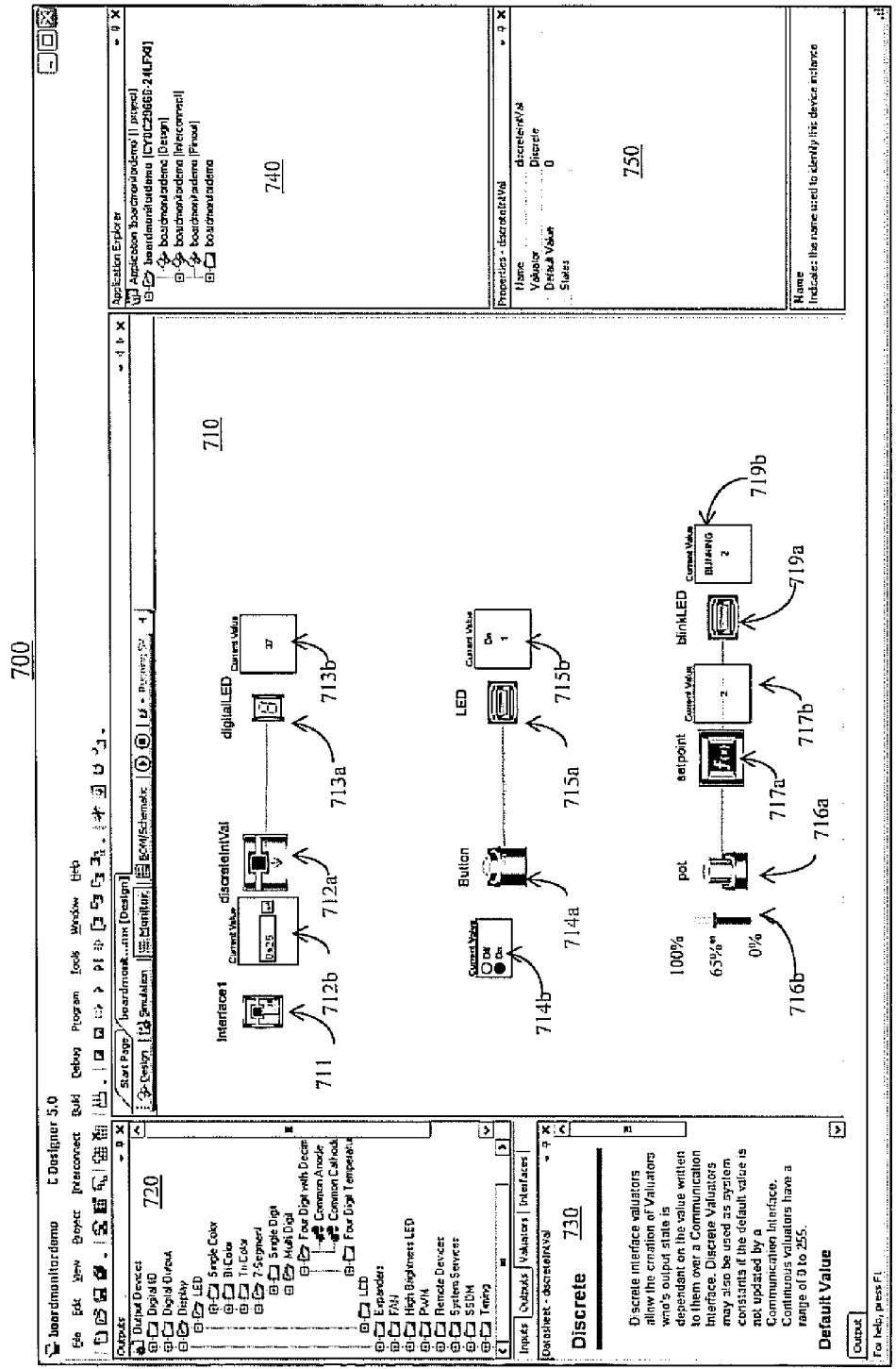
FIG. 6 is a block diagram of an exemplary graphical user interface (GUI) in accordance with one embodiment of the present invention.

FIG. 6 is a block diagram of an exemplary graphical user interface (GUI) 700 in accordance with one embodiment of the present invention. In one embodiment, GUI 700 helps a user select parameter values for design elements. While the present invention facilitates automation of design activities, it can also flexibly prompt a set of questions in a convenient and efficient interface until desirable user information on design elements is retrieved. The GUI 700 can include one or more editable input mechanisms for specifying parameters of the given design element. In one exemplary implementation, the express design system also determines if a specified value of a given parameter impacts another parameter of a design element. If one or more design element parameters change as a result of a change to a given parameter, the GUI displays the new value of the given parameter that changed along with changes to the other parameters. Graphical user interface GUI 700 includes a main portion 710, design element catalog portion 720, data sheet portion 730, application portion 740 and properties portion 750. Main portion 710 displays a design in variety of convenient presentations.

The main portion 710 can display widget icons and corresponding information boxes incorporated in a design. For example, the main portion can display widget icons including interface icon 711, valuator icon 712a, digital 8 segment LED icon 713a, pushbutton icon 714a, LED 715a, potentiometer icon 716a, setpoint icon 717a, and blink icon 719a. The main portion also displays corresponding information boxes including valuator information box 712b, digital 8 segment LED information box 713b, pushbutton information box 714b, LED information box 715b, potentiometer information box 716b, setpoint information box 717b, and blink information box 719b.

It is appreciated, items in the GUI may be displayed with different visual attributes. For example, color, highlighting or the like may be used to organize, associate or differentiate one or more items from one or more other items in the GUI. The information boxes can include a variety of information associated with a design element including status, present or current value indications, and transfer function indications. Associations or relationships between design elements can be indicated with lines between the design icons.

The design element catalog portion 720 includes a listing of various design elements. A user can create a circuit design by dragging and dropping high level "widget" icons representing design elements within a design window. In one implementation, the user may select a design element from a design element catalog portion of the design window. In selecting a design element, the user drags a widget icon from the design element catalog 720 to a design element selection and interconnection of the main portion 710 of the design window. The user may also include an association or "connection" between the design elements by linking corresponding widget icons, in the design element selection and interconnection of main portion 710.

The design element data sheet portion 730 displays technical data concerning corresponding design elements. Properties portion 750 displays parameters and parameter values for corresponding design elements, and or the like. Application portion 740 includes information on an application or project the design is associated with.

Figure 7:
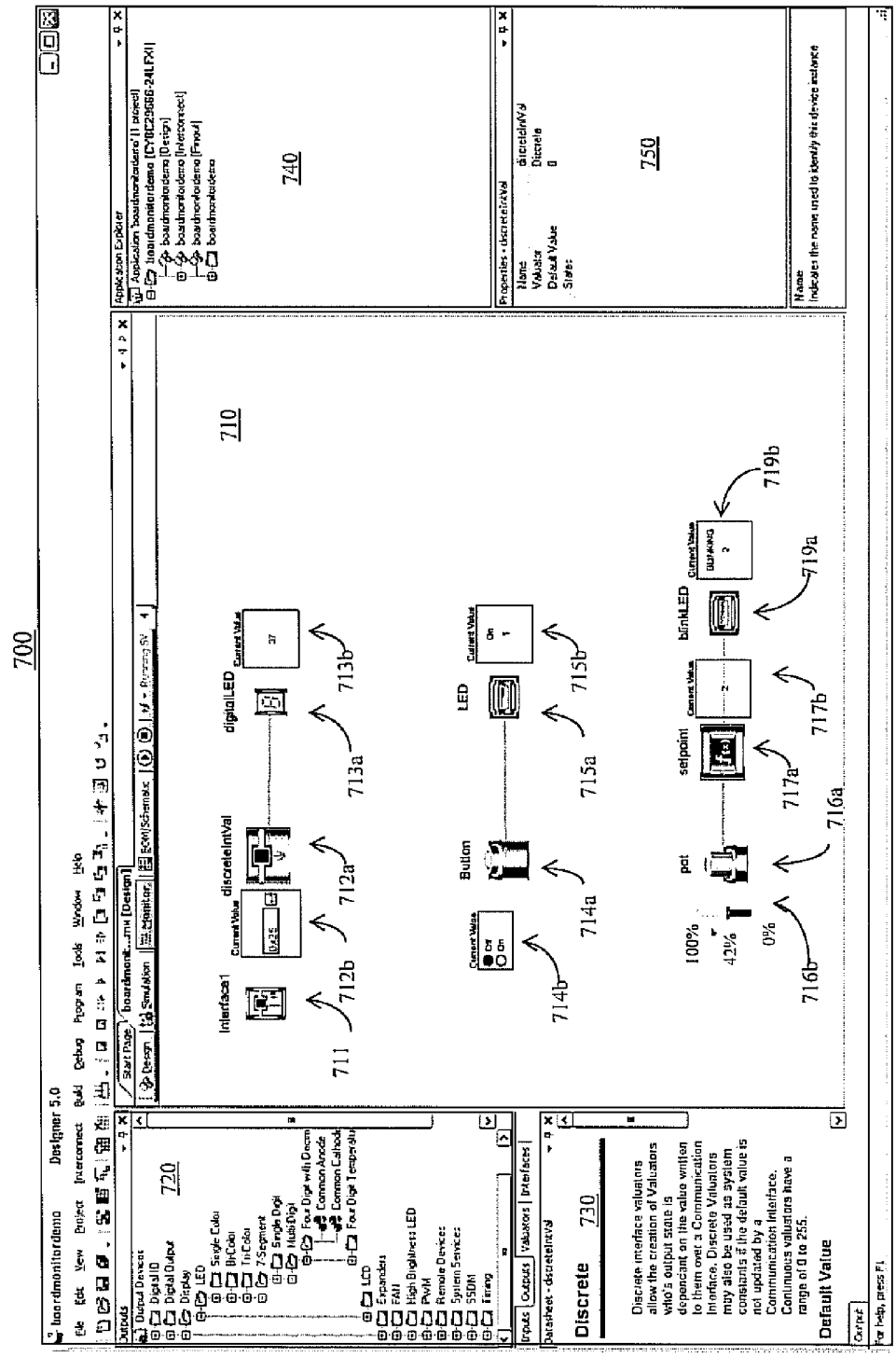
FIG. 7 is block diagram of exemplary graphical user interface (GUI) with updated information in accordance with one embodiment of the present invention.

It is appreciated that exemplary graphical user interface (GUI) 700 can be utilized in a monitor mode. In one embodiment exemplary graphical user interface (GUI) 700 is utilized to monitor a target device during run-time. In one exemplary implementation, the information displayed on the exemplary graphical user interface (GUI) 700 can be updated in real time to reflect run time operations of the target device. It is appreciated that graphical user interface (GUI) 700 can be utilized to monitor an actual target device or emulation of a target device. FIG. 7 is block diagram of exemplary graphical user interface (GUI) 700 with updated information in accordance with one embodiment of the present invention. In FIG. 7 the current value presented in the valuator information box 712b, pushbutton information box 714b, LED and potentiometer information box 716b has changed from the information presented in FIG. 6.

Figure 8A:
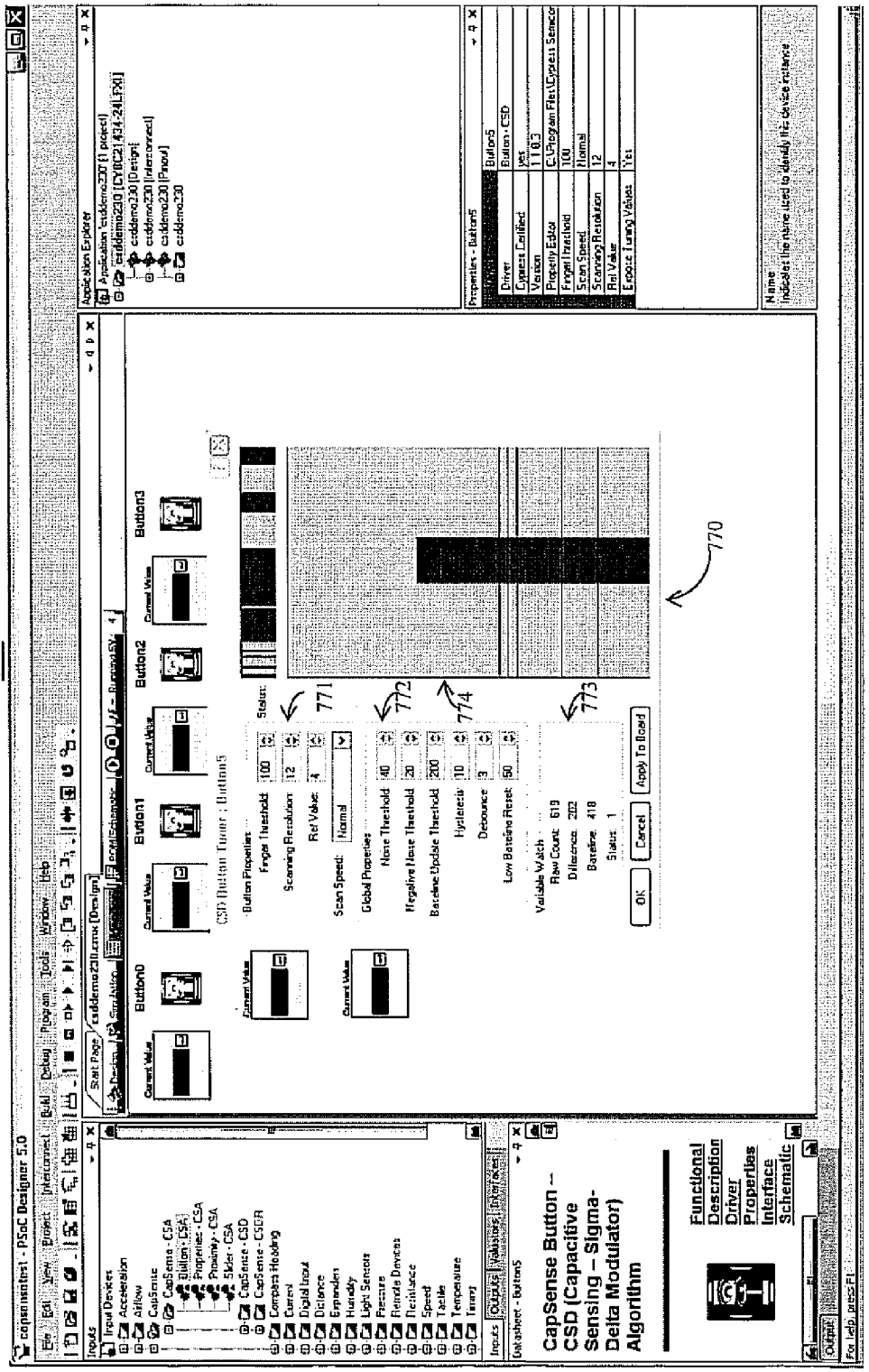
FIG. 8A is a block diagram of an exemplary graphical user interface with different design information including a configuration box presenting configuration information in accordance with one embodiment of the present invention.
Figure 8B:
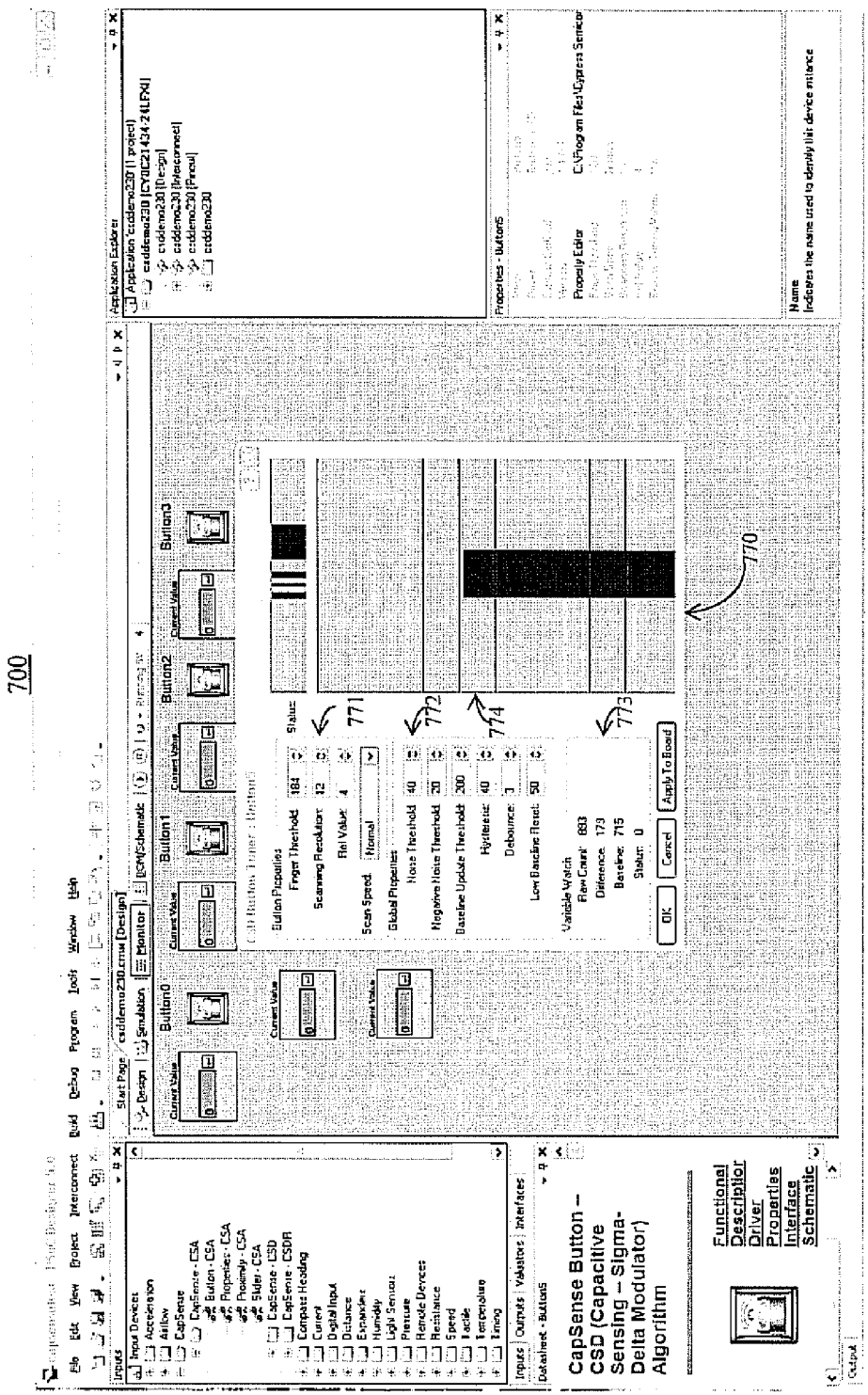
FIG. 8B is a block diagram of an exemplary graphical user interface presenting changes in a configuration box in accordance with one embodiment of the present invention.

Additional configuration information can be also be presented. FIG. 8A is a block diagram of graphical user interface (GUI) 700 with different design information including a configuration box 770 presenting configuration information. In one exemplary implementation, configuration box 770 includes a device element specific portion 771, global information portion 772, variable information portion 773 and a graphical representation portion 774. A user can indicate changes to the configuration information at both original design and in a tuner mode during run time. In one exemplary implementation a user can direct a change in a widget specific value that is also reflected in the graphical representation portion. For example, a user can change the button property finger threshold value of 100 shown in portion 771 of FIG. 8A to a value of 184 shown in FIG. 8B and the corresponding indications of the change can be reflected in the graphical portion 774.

Figure 9A:
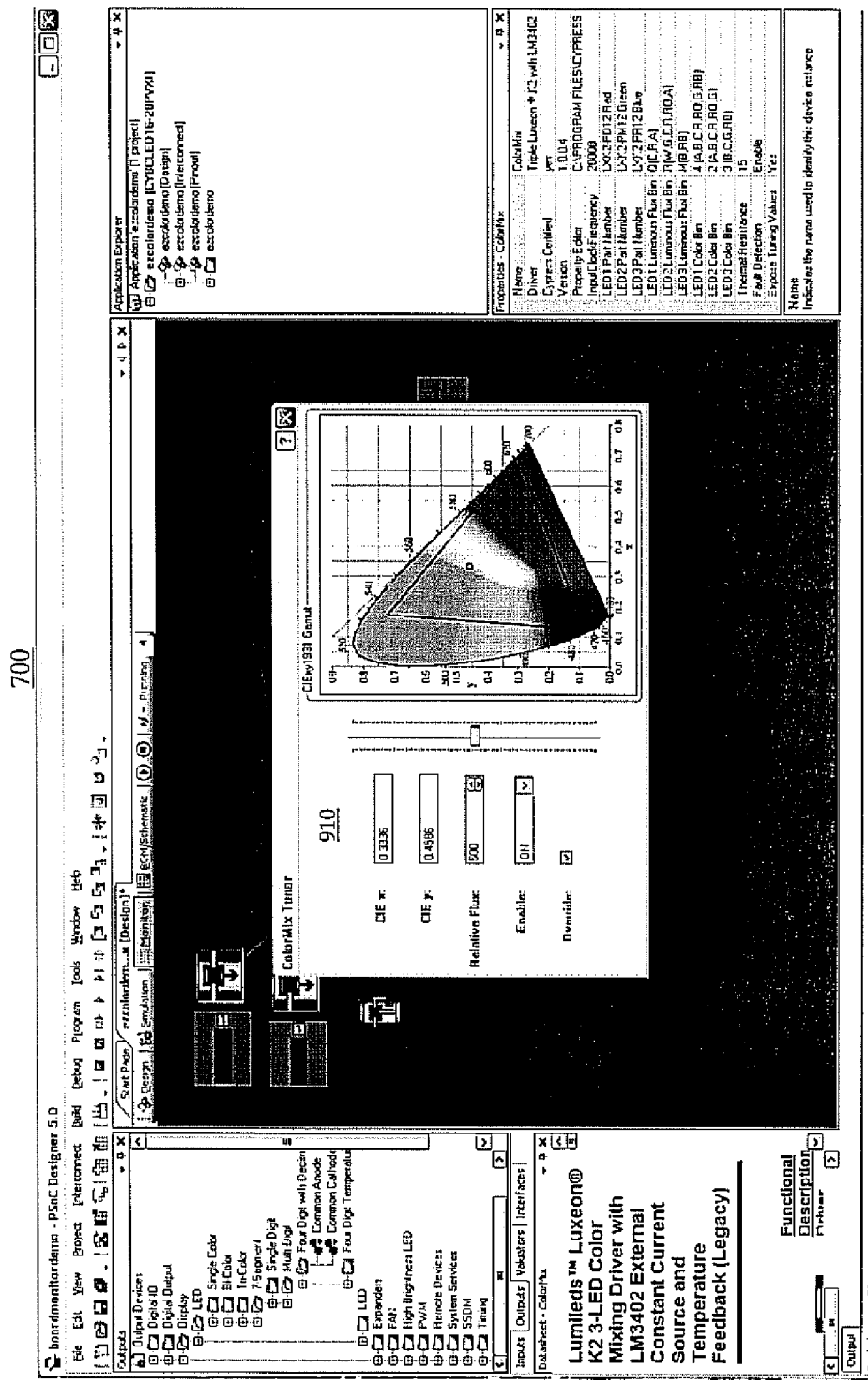
FIG. 9A is a block diagram of an exemplary graphical user interface showing configuration information associated LED design element in accordance with one embodiment of the present invention.
Figure 9B:
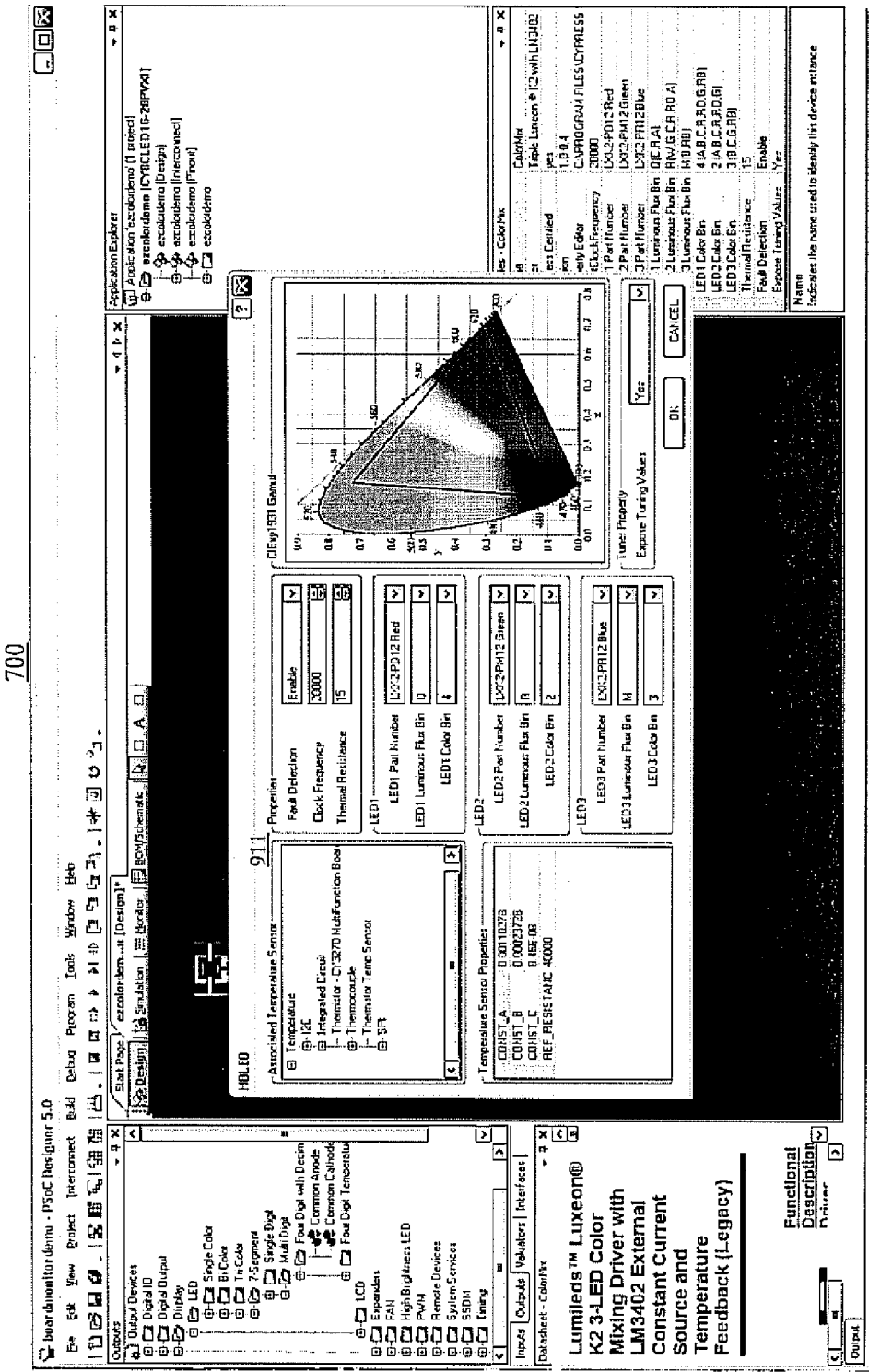
FIG. 9B is a block diagram of an exemplary graphical user interface showing different configuration information associated LED design element in accordance with one embodiment of the present invention.
Figure 10:
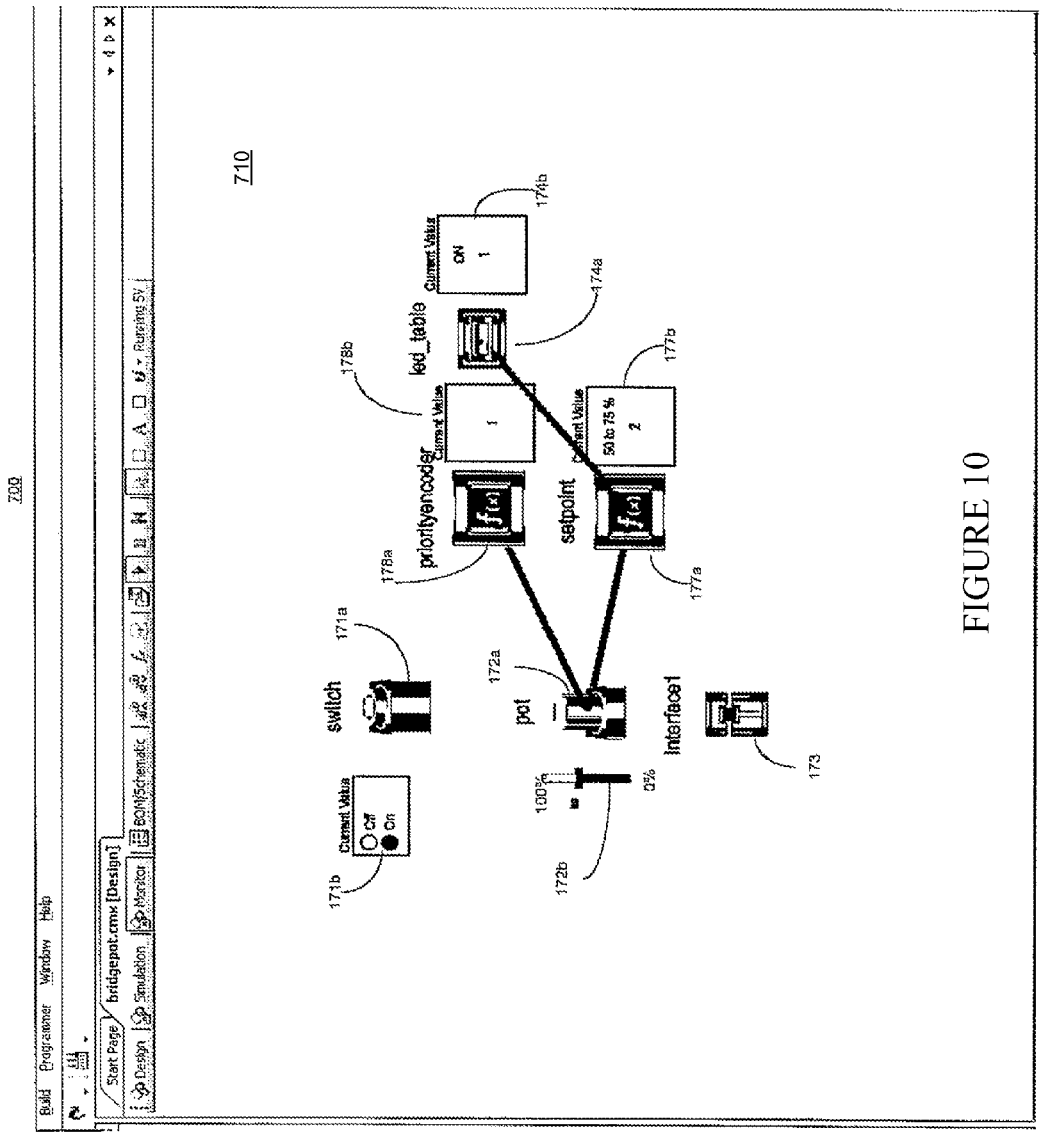
FIG. 10 is a block diagram of an exemplary graphical user interface showing different design information in accordance with one embodiment of the present invention.

It is appreciated that a variety of configuration presentations are readily adapted to the present invention. FIG. 9A is block diagram of exemplary graphical user interface (GUI) 700 showing different information in a configuration box 910. For example, FIG. 9A shows an exemplary presentation of configuration information for an LED widget. It is also appreciated a variety of different levels of detail or granularity can be presented. FIG. 9B shows another exemplary presentation of information for an LED widget with additional configuration information 911 conveniently presented It is appreciated that a variety of different designs can be presented in main portion 710. For example, FIG. 10 is a block diagram of a graphical user interface (GUI) 700 with different information in main portion 710. For example, main portion 710 includes switch icon 171a, potentiometer icon 172a, interface icon 173 and led icon 174a with corresponding switch information box 171b, potentiometer information box 172b, and led information box 174b. It is appreciated the information can be presented as graphic representation of the information (e.g., potentiometer information box 172a include a potentiometer scale graphic). The GUI main portion 710 also includes function transfer indicators including priority encoder icon 178a and setpoint icon 177a and respective corresponding encoder information box 178b and setpoint information box 177b.

Figure 2:
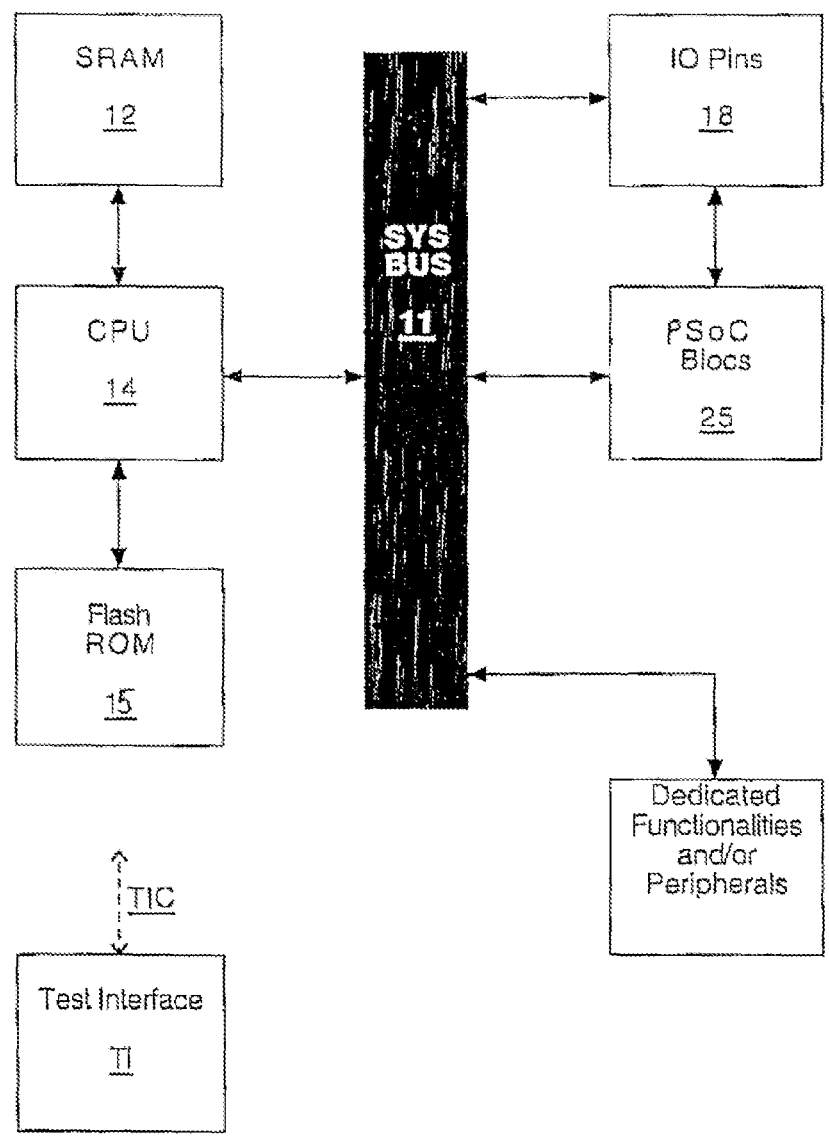
FIG. 2 is a block diagram showing a high level view of an exemplary target device integrated circuit upon which embodiments of the present invention may be implemented.

FIG. 2 is a block diagram showing a high level view of an exemplary target device integrated circuit 10 upon which embodiments of the present invention may be implemented. In one embodiment, target device integrated circuit 10 includes a communication bus 11, static random access memory (SRAM) 12, central processing unit (CPU) 14, flash read-only memory (ROM) 15, input/output (I/O) pin(s) 18 and configurable functional component 25. Communication bus 11 is electrically coupled to static random access memory (SRAM) 12, central processing unit (CPU) 14, flash read-only memory (ROM) 15, input/output (I/O) pin(s) 18 and functional component 25. Static random access memory (SRAM) 12 stores volatile or temporary data during firmware execution. Central processing unit (CPU) 14 processes information and instructions. Flash read-only memory (ROM) 15 stores information and instructions (e.g., firmware). In one embodiment of the present invention, flash read-only memory (ROM) 15 stores configuration image data. Input/output (I/O) pin(s) 18 provides an interface with external devices (not shown). Configurable functional component 25 is programmable to provide different functions and configurations.

Figure 3:
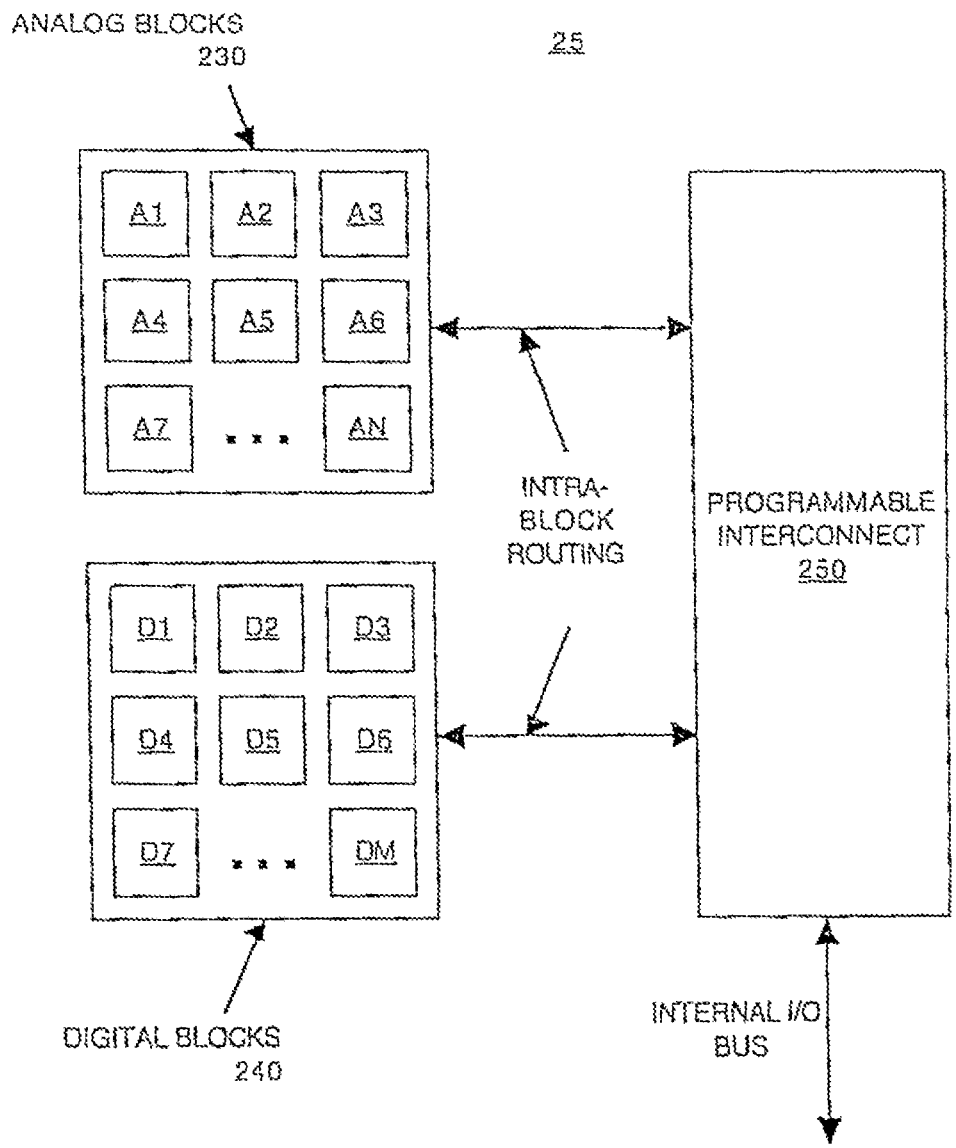
FIG. 3 is a block diagram of an exemplary target device functional component in accordance with one embodiment of the present invention.

One embodiment of a target device functional component 25 is depicted in greater detail in FIG. 3. In this embodiment, target device functional component 25 includes an analog functional block 230, a digital functional block 240, and a programmable interconnect 250. In one exemplary implementation, analog functional block 230 includes a matrix of interconnected analog functional blocks A1 through AN. The number N may be any number of analog functional blocks. Likewise, digital block 240 includes a matrix of interconnected digital functional blocks D1 through DM. The number M may be any number of digital functional blocks.

The analog functional blocks A1 through AN and the digital functional blocks D1 through DM are fundamental building blocks (e.g., fundamental circuits) that may be combined in a variety of configurations to accomplish a variety of functions. Importantly, different combinations of blocks producing different functions may exist at different times within the same system. For example, a set of functional blocks configured to perform the function of analog-to-digital conversion may sample a signal. After processing that signal in the digital domain, some or all of those same blocks (perhaps in conjunction with others) may be recombined in a different configuration to perform the function of digital-to-analog conversion to produce an output signal.

In one embodiment of the present invention, the programmable configuration of integrated circuit 10 components is facilitated by memory (e.g., configuration registers) included in the integrated circuit. In one exemplary implementation of the present invention, the memory includes configuration registers that store a series of logical values (e.g., logical 1 or 0 corresponding to a predetermined voltage level) corresponding to a particular configuration and/or function for an integrated circuit 10 functional block. The series of logic values are programmably configurable and in one embodiment of the present invention the logical values loaded in a configuration register are defined by a configuration image (e.g., stored in a system memory 17).

In one embodiment of the present invention, the configuration and functionality of an electronic device (e.g., a programmable component) is defined by a configuration image loaded in a memory of the electronic device (e.g., micro controller 10). The information comprising the configuration image may be represented in varying degrees of abstraction. At a low level of abstraction the configuration image is represented by source code (e.g., assembly or machine language) stored as logical values (e.g., logical ones and zeroes) in a memory (e.g., in a system on a chip). At a higher level of abstraction the configuration image is represented by textual definitions or graphical images (e.g., in a design tool). Additional details on an exemplary implementation of a present invention design tool are set forth in commonly-owned U.S. Pat. No. 6,971,004, application Ser. No. 9/989,817, filed Nov. 19, 2001 entitled "System and Method of Dynamically Reconfiguring a Programmable System on a Chip" and patent application Ser. No. 10/256, 829, filed Sep. 27, 2002 entitled "Graphical User Interface for Dynamically Reconfiguring a Programmable Device", which are hereby incorporated by this reference.

FIG. 4A is a flow chart of target device monitoring update method 400A in accordance with one embodiment of the present invention. In one embodiment, target device monitoring method 400 facilitates updating of "widget" presentations in real time. The widget presentations are associated with register values of an operating target device.

In block 410, a change in design element value in real time is received, wherein the design element value is associated with an operating target device. In one embodiment, the receiving includes directing monitoring of design element value information alteration feedback in a target device.

In block 420, the changes in the design element value are analyzed. The analyzing includes determining if a change in the design element value impacts another design element value.

In block 430, express interface information is updated in accordance with results of the analyzing. In one embodiment, updated express interface information is presented in user friendly intuitive graphics user interface. In one exemplary implementation, the updating includes presenting updates symbolically. For example, the updating can include updating widget information corresponding to the design element value. A design element value can include a value associated with one of an input value, transfer function valuator or output value.

In one embodiment, method 400 further includes comparing the changes in the design element values associated with an operating target device to design element values associated with a simulation of a target device.

Figure 4B:
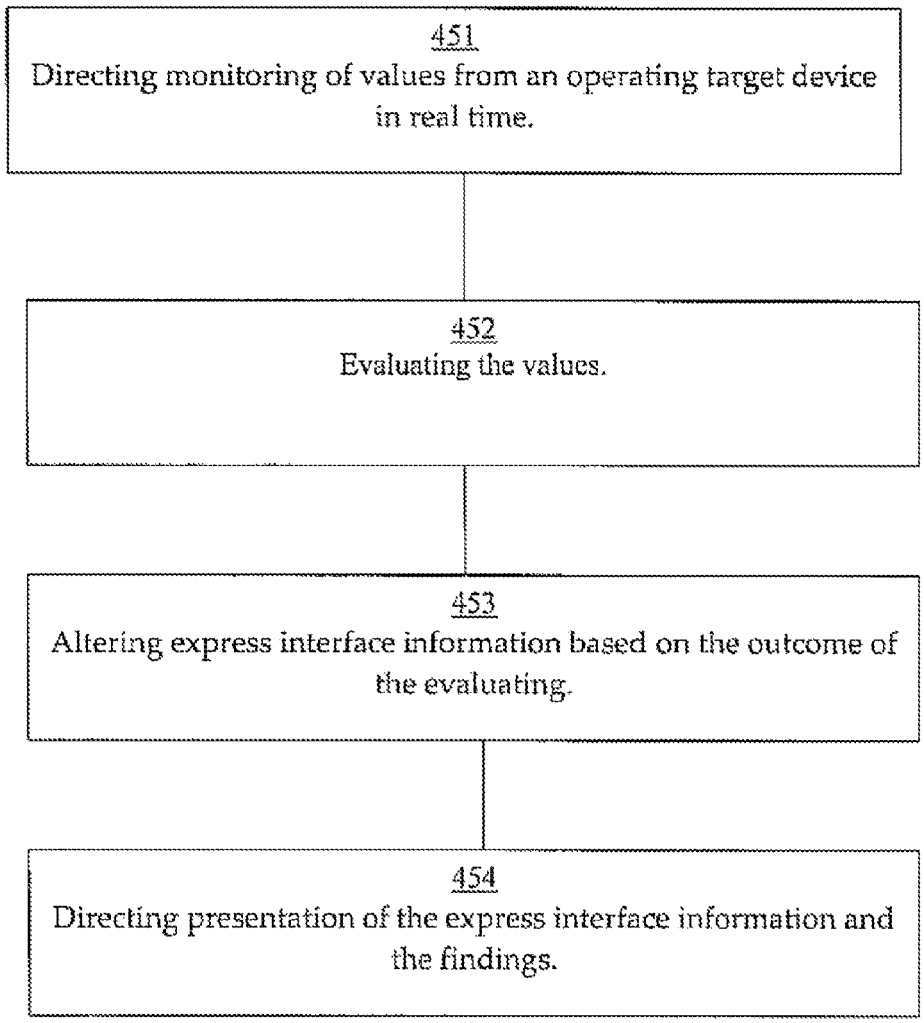
FIG. 4B is a flow chart of another exemplary target device monitoring update method in accordance with one embodiment of the present invention.

FIG. 4B is a flow chart of another exemplary target device monitoring update method 400B in accordance with one embodiment of the present invention. In one embodiment a monitor update method 400B includes the following instructions.

In block 451 monitoring of values from an operating target device is directed in real time. In one exemplary implementation, values include states of the operating target device in real time.

In block 452 the values are evaluated. In one embodiment, the evaluating includes examining if a second value of the target device is affected by a change in a first value associated with the target device.

In block 453, express interface information is altered based on the outcome of the evaluating. In one embodiment, the altering includes incorporating information associated with findings of the evaluating into the express information.

In block 454, presentation of the express interface information and the findings is directed. In one embodiment, the presentation is a user friendly symbolic graphical user interface that reflects the altering of the express interface information symbolically.

In one embodiment, instructions for implementing method 400A and 400B are stored on a computer readable medium and the instructions direct processor operations.

Figure 5A:
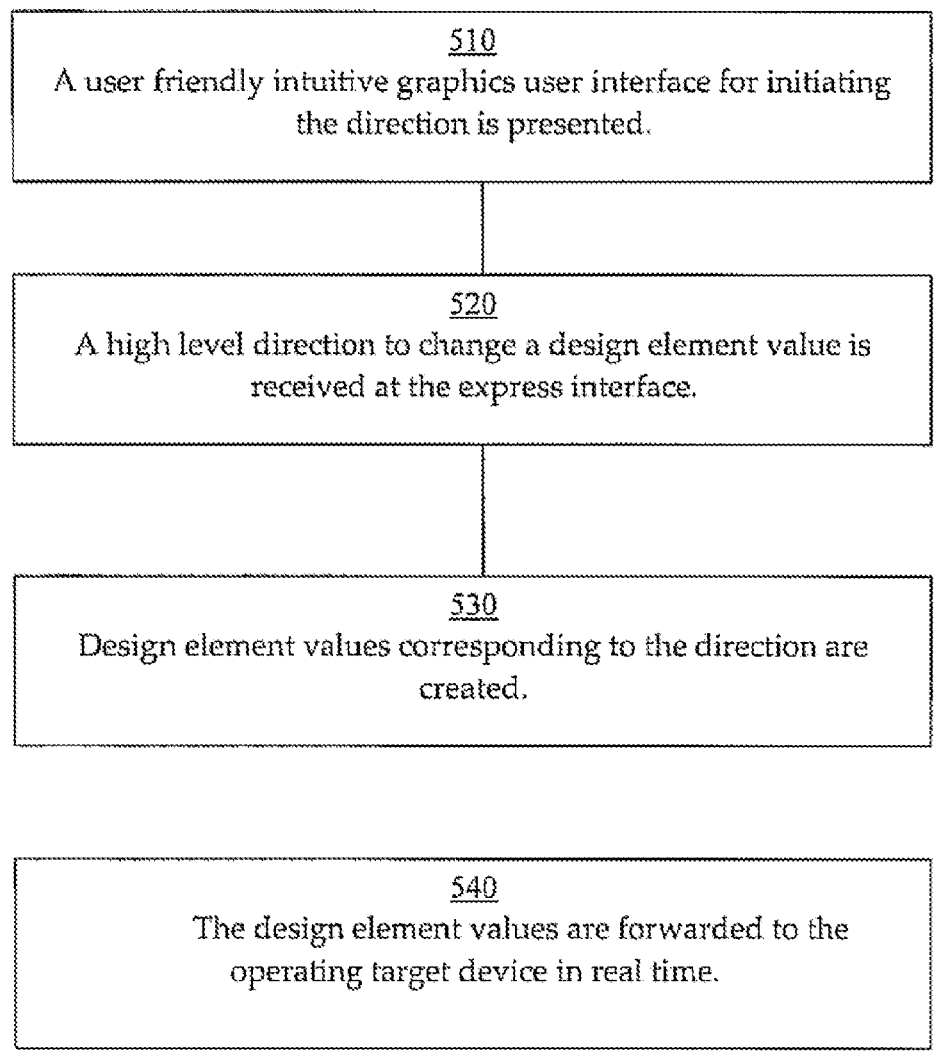
FIG. 5A is a flow chart of an exemplary host emulation target device control method in accordance with one embodiment of the present invention.

FIG. 5A is a flow chart of exemplary host emulation target device control method 500A in accordance with one embodiment of the present invention.

In block 510, a user friendly intuitive graphics user interface for initiating the direction is presented. In one embodiment the GUI includes widgets representing design elements of a target device.

In block 520, a high level direction to change a design element value is received at the express interface. In one embodiment, design element values are associated with an operating target device. In one exemplary implementation, the changes are symbolically initiated. The receiving can include directing monitoring of design element value information alteration feedback from the target device. In one exemplary implementation, a first design element value is changed and feedback from the target device is received wherein the feedback is associated with changes that result in other design element values as a result of the change in the first design element value.

In block 530, design element values corresponding to the direction are created. In one embodiment, the creating includes updating widget information corresponding to the changes in the design element values. The design element value can be associated with an input, transfer function valuators or an output. In one exemplary implementation the creating includes analyzing the direction to determine if another design element is impacted by the change and making corresponding changes to the other design element.

In block 540, the design element values are forwarded to the operating target device in real time.

In one embodiment, the changes in the design element values associated with an operating target device are compared to design element values associated with a simulation of a target device. The comparison can be utilized to troubleshoot and determine if the target device is operating correctly in accordance with expected values and/or if the simulation is an accurate representation of real world experience.

Figure 5B:
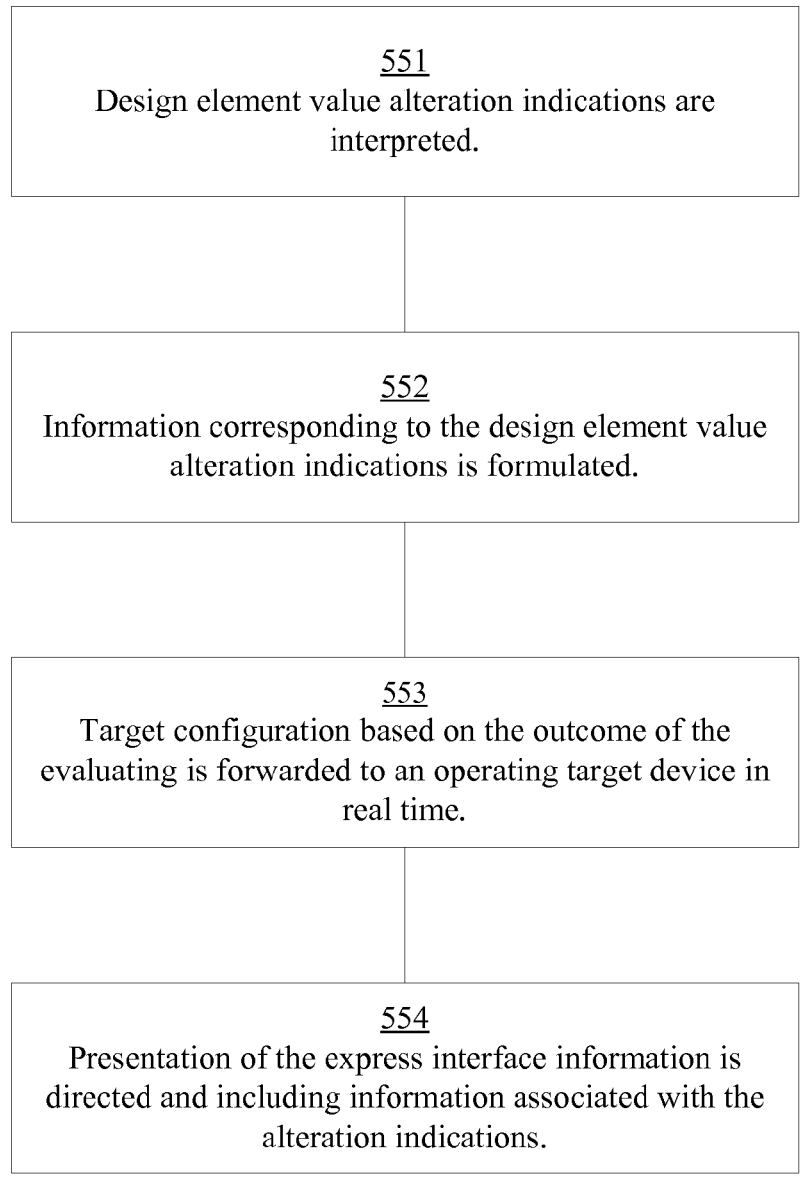
FIG. 5B is a flow chart of another exemplary target device monitoring update method in accordance with one embodiment of the present invention.

FIG. 5B is a flow chart of target device monitoring update method 500B in accordance with one embodiment of the present invention. In one embodiment a monitor update method 500B includes the following instructions.

In block 551, design element value alteration indications are interpreted. In one embodiment, the values include states of the operating target device in real time.

In block 552, information corresponding to the design element value alteration indications is formulated. In on embodiment, the formulating comprises examining if a second value of the target device is affected by a change in a first value associated with the target device; and incorporating information associated with examination into the express interface information and target configuration information.

In block 553, target configuration information based on the outcome of the evaluating is forwarded to an operating target device in real time.

In block 554, presentation of the express interface information is directed, including information associated with the alteration indications. In one embodiment, the presentation is a user friendly symbolic graphical user interface that reflects the altering of the express interface information symbolically.

In one embodiment, instructions for implementing method 500A and method 500B are stored on a computer readable medium and the instructions direct processor operations.

Thus, the present invention provides convenient and efficient real time monitoring and updating of an electronic device. An electronic device design of the present invention facilitates dynamic monitoring and programmability that enables operationally smooth (e.g., "on the fly") changes in the configuration and/or functionality of the electronic device with minimal or no disruptions to device operations. The present invention allows utilization of the same components to perform different functions and take on different configurations that are capable of satisfying the requirements of different applications. A present invention monitoring and update system also facilitates troubleshooting of device components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A target device control method comprising:
receiving high level express interface direction to change one or more design element values of a set of user-selectable design element values, wherein said one or more design element values are associated with an application operating on a target device during said receiving;
creating the one or more design element values corresponding to said direction;
analyzing said direction to determine if another design element value of the set of user-selectable design element values is impacted by said change, wherein the another design element value affects operation of the application on the target device;
in response to determining that said another design element value of the application is impacted by said change, automatically updating the target device in real time by forwarding an updated value for said another design element value to said target device during operation of the application on the target device.

2. A target device control method of claim 1 further comprising presenting a user friendly intuitive graphics user interface for initiating said direction.

3. A target device control method of claim 2 wherein changes to said one or more design element values are symbolically initiated.

4. A target device control method of claim 1 wherein said creating includes updating widget information corresponding to changes in said one or more design element values.

5. A target device control method of claim 4 wherein the one or more design element values are associated with an input, transfer function valuators or an output.

6. A target device control method of claim 1 wherein update data is received from communication registers of said target device.

7. A target device control method of claim 3 further comprising comparing said changes in said one or more design element values associated with an operating target device to one or more design element values associated with a simulation of a target device.

8. A target device control method of claim 1 wherein said receiving includes directing monitoring of design element value information alteration feedback from said target device.

9. An express design system comprising:
a target device for implementing a design definition for an application;
a host computer system for creating said design definition based on a direction to change one or more design element values of a set of user-selectable design element values and in response to determining that another design element value is impacted by said change, automatically updating the target device in real time by forwarding an updated value for said another design element value to said target device during operation of the application on the target device, wherein the another design element value affects operation of the application on the target device; and a board monitor component for interfacing between said host computer system and said target device in real time.

10. An express design system of claim 9 wherein said board monitor component comprises:
   a USB interface for interfacing with said host computer system; and
   an I2C interface for interfacing with said target device.

11. An express design system of claim 9 wherein said board monitor is working on a hex file as said hex file is executing on said target device.

12. An express design system of claim 11 wherein said hex file is static.

13. An express design system of claim 9 wherein said host computer system comprises a graphical user interface presentation in a user friendly intuitive configuration for inputting design element changes.

14. An express design system of claim 9 wherein said one or more design element values include symbolically indicated inputs.

15. A non-transitory computer readable medium for storing instructions directing processor operations, wherein said instructions comprise:
   interpreting a design element value alteration indication for a first value associated with an application operating on an operating target device;
   formulating target update information corresponding to said design element value alteration indication, wherein said formulating comprises examining if a second value of the set of user-selectable design element values associated with the application is affected by a change in the first value, wherein the second value affects operation of the application on the target device; and
   in response to determining that the second value is affected by the change in the first value, automatically forwarding target update information for the second value to the operating target device in real time during operation of the application on the operating target device.

16. A non-transitory computer readable medium of claim 15, wherein said formulating comprises:
   incorporating information associated with said examining into express interface information.

17. A non-transitory computer readable medium of claim 16 further comprising directing of presentation of said express interface information and information associated with said design element value alteration indication.

18. A non-transitory computer readable medium of claim 17 wherein said presentation is a user friendly symbolic graphical user interface that reflects said altering of said express interface information symbolically.

19. A computer readable storage medium of claim 15 wherein said values include states of said operating target device in real time.

* * * * *